United States Patent
Kariya

Patent Number: 6,140,570
Date of Patent: Oct. 31, 2000

[54] PHOTOVOLTAIC ELEMENT HAVING A BACK SIDE TRANSPARENT AND ELECTRICALLY CONDUCTIVE LAYER WITH A LIGHT INCIDENT SIDE SURFACE REGION HAVING A SPECIFIC CROSS SECTION AND A MODULE COMPRISING SAID PHOTOVOLATIC ELEMENT

[75] Inventor: Toshimitsu Kariya, Soura-gun, Japan

[73] Assignee: Canon Kabushiki Kaisha, Tokyo, Japan

[21] Appl. No.: 09/179,834

[22] Filed: Oct. 28, 1998

[30] Foreign Application Priority Data

Oct. 29, 1997 [JP] Japan ................................. 9-311604

[51] Int. Cl.$^7$ .................................................. H01L 31/04
[52] U.S. Cl. ........................ 136/256; 136/251; 136/246; 136/259; 136/262; 136/265; 136/252; 257/53; 257/433; 257/437; 257/464; 257/466; 204/192.29; 204/192.27
[58] Field of Search ........................ 136/256, 251, 136/246, 259, 261, 262, 265, 252; 257/53, 433, 437, 464, 466; 204/192.29, 192.27

[56] References Cited

U.S. PATENT DOCUMENTS

| | | | |
|---|---|---|---|
| 4,808,462 | 2/1989 | Yaba et al. | 136/256 |
| 5,453,135 | 9/1995 | Nakagawa et al. | 136/256 |
| 5,486,238 | 1/1996 | Nakagawa et al. | 136/256 |
| 5,500,055 | 3/1996 | Toyama et al. | 136/256 |
| 5,885,725 | 3/1999 | Toyama et al. | 136/256 |

FOREIGN PATENT DOCUMENTS 084888  4/1986  Japan.

OTHER PUBLICATIONS

Hamakawa et al., "New Types . . . and α–Si", Appl. Phys. Lett. 43, 7 644–646, Oct. 1983.

Tiedje et al., "Enhanced . . . Silicon Films", 16th IEEE Photovoltaic Spec. Conf.,San Diego, CA 1423–1424, Sep.1982.

Deckman et al., "Optical Enhancement of α–SiH$_x$ Solar Cells", 16th IEEE Photovoltaic Spec. Fonf. 1425–1426 Sep. 1982.

*Primary Examiner*—Alan Diamond
*Attorney, Agent, or Firm*—Fitzpatrick, Cella, Harper & Scinto

[57] ABSTRACT

A photovoltaic element having a specific transparent and electrically conductive layer on a back reflecting layer, said transparent and electrically conductive layer comprising a zinc oxide material and having a light incident side surface region with a cross section having a plurality of arcs arranged while in contacted with each other, said arcs having a radius of curvature in the range of 300 Å to 6 μm and an angle of elevation from the center of the curvature in the range of 30 to 155°, and said cross section containing regions comprising said plurality of arcs at a proportion of 80% or more, compared to the entire region of the cross section.

21 Claims, 12 Drawing Sheets

SEMICONDUCTOR LAYER

F I G. 16
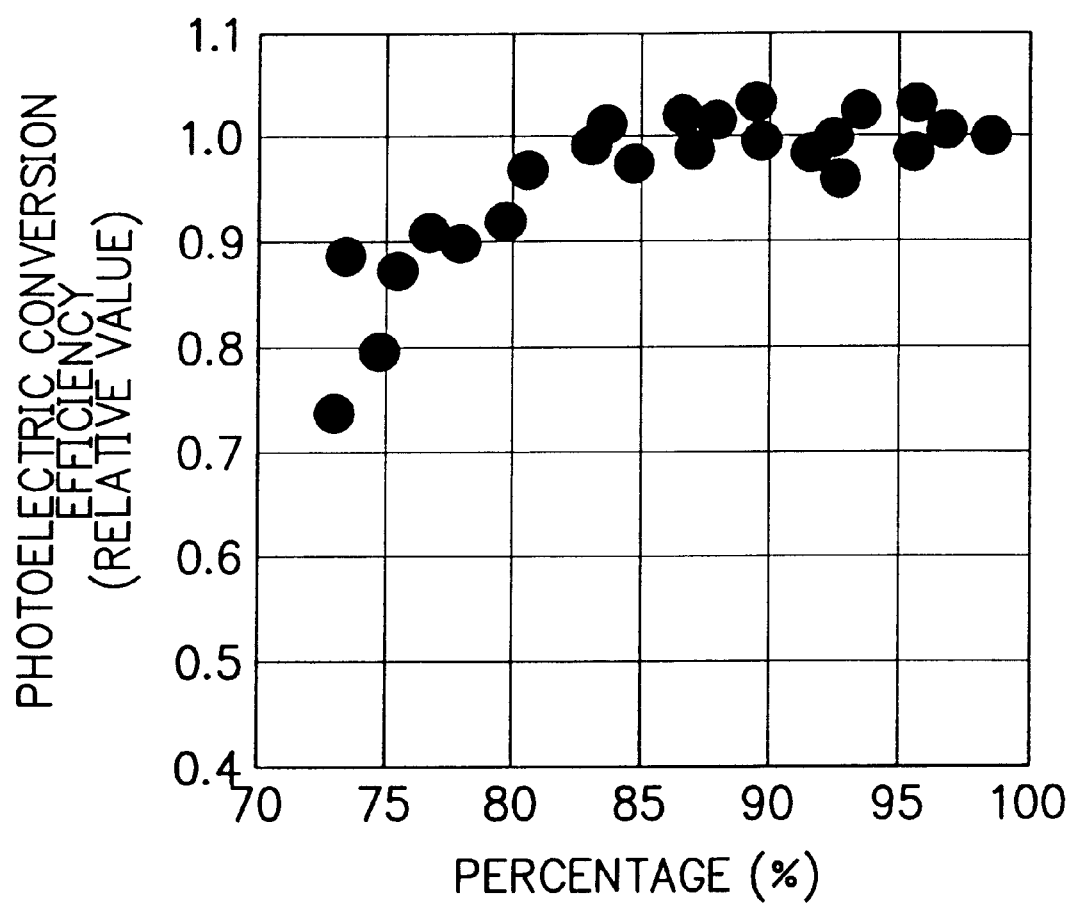

PHOTOVOLTAIC ELEMENT HAVING A BACK SIDE TRANSPARENT AND ELECTRICALLY CONDUCTIVE LAYER WITH A LIGHT INCIDENT SIDE SURFACE REGION HAVING A SPECIFIC CROSS SECTION AND A MODULE COMPRISING SAID PHOTOVOLATIC ELEMENT

BACKGROUND OF THE INVENTION

1. Field of the Invention

The present invention relates to a non-single crystal silicon photovoltaic element having an improved durability and a satisfactory photoelectric conversion efficiency and a module comprising said photovoltaic element. More particularly, the present invention relates a photovoltaic element comprising a non-single crystalline silicon semiconductor material and a back reflector having a light incident side surface with a specific cross section and which excels in durability and exhibits a satisfactory photoelectric conversion efficiency, and a module comprising said photovoltaic element (this module will be hereinafter referred to as photovoltaic element module). The photovoltaic element in the present invention includes a solar cell. The photovoltaic element module in the present invention includes a solar cell module.

2. Related Background Art

For a photovoltaic element (such as a solar cell) having a semiconductor layer comprising a non-single crystalline silicon semiconductor material and having at least a pin junction (this photovoltaic element will be hereinafter referred to as non-single crystal silicon photovoltaic element), there has been proposed a manner of improving the photoelectric conversion efficiency by forming its back reflecting layer with a metal having a high reflectivity against visible light (that is, light having a wavelength in the visible region), such as Ag, Cu, or Al. However, it is known that a metal such as Ag or Cu, which has a high reflectivity against visible light, is liable to cause a so-called migration phenomenon in the presence of moisture and an electric field.

Various studies have been made in order to prevent such migration phenomenon from occurring. For instance, Katoh et al. have reported experimental results of the migration mechanism of Ag series metal (see, R. Katoh and T. Shimizu, *Japan Electronic Material Technology Association Bulletin*, "anti-migration characteristics of Ag-Pd allow powder"). In addition, in *Copper Technology Research Association Bulletin*, vol. 30, pages 124–130, "The Characteristics of Electrochemical Migration in Copper-Base Alloy" by T. Tohe et als., there is a disclosure as follows. In order to improve the reliability of electric devices, with respect to the migration resistance of a copper alloy, as a result of examining the kinds of the constituent elements of the alloy and the amount of the elements added, the addition of silicon (Si) provided a significant improvement in the anti-migration characteristics. When nickle (Ni) was added to a Cu—Si alloy, followed by aging, a more improved effect was provided.

Further, when Ag is added with Cu, In, or Pd, or when Cu is added with Ni or Si, it is possible to prevent occurrence of migration to a certain extent. However, in any case, the addition of a different metal is liable to entail a problem of decreasing the reflectivity of the matrix metal (Ag or Cu) against visible light. In this connection, it is considered to be advantageous that the back reflecting layer of a photovoltaic element is comprised of a thin film layer formed of a metallic material containing aluminum as a matrix.

Separately, for a non-single crystal silicon photovoltaic element, there is known a technique wherein a transparent and electrically conductive layer is interposed between a back reflecting layer and a semiconductor layer, and the transparent and electrically conductive layer is designed to have a surface provided with a irregular structure (or a textured structure), thereby providing improved light absorption efficiency. This technique is described, for instance, in Hamakawa et al., *Appl. Phys. Lett.*, 43. P. 644 (1983); T. Tiedje etal., *Proc. 16th IEEE Photovoltaic Specialist Conf.*, P. 1423 (1982); H. Deckman et al., *Proc. 16th IEEE Photovoltaic Specialist Conf.*, P. 1425 (1982); and Japanese Unexamined Patent Publication No. 84888/1986.

For the transparent and electrically conductive layer, it is known that it is advantageous to use zinc oxide in the formation thereof.

Based on the above description, in the case of a non-single crystal silicon photovoltaic element comprising at least a semiconductor layer comprising a non-single crystalline silicon semiconductor material and a back reflecting layer, it is understood to be advantageous that the back reflecting layer is constituted by aluminum, and a transparent and electrically conductive layer constituted by zinc oxide and having a surface with a textured structure is interposed between the back reflecting layer and the semiconductor layer.

However, even in the case of a non-single crystal silicon photovoltaic element having such back reflecting layer and transparent and electrically conductive layer as above described, the non-single crystal silicon photovoltaic element still has a disadvantage such that it is difficult to satisfy the requirements for high photoconductive characteristics, high durability, and low production cost.

Besides this, there are also such disadvantages as will be described hereafter. When forming a zinc oxide thin film on a metal thin film formed of a given metal, the growth of the zinc oxide film is greatly affected by the constituent, surface pattern, and surface cleanliness of the metal thin film. Therefore, it is difficult for the zinc oxide film to be consistently formed so as to have a desirable surface pattern with a textured structure which exhibits a high light collecting efficiency. Hence, it is difficult to consistently form, on a metal thin film composed of a metallic material containing aluminum as a matrix (this metallic material will be hereinafter referred to as "aluminum based metallic material") as the back reflecting layer, a zinc oxide thin film having a desirable surface pattern with a textured structure which exhibits a high light collecting efficiency.

In order to form, on a metal thin film composed of an aluminum based metallic material as the back reflecting layer, a zinc oxide thin film as the transparent and electrically conductive layer so that it has such surface pattern provided with the textured structure, there is known a method of forming said zinc oxide thin film to have a relatively large thickness of about 3 $\mu$m, and a method of forming said zinc oxide thin film by means of sputtering using a gas mixture comprising Ar gas and $H_2O$ gas. However, both of these two methods are problematic. That is, in the case of the former method, particularly the production cost of a photovoltaic element obtained unavoidably becomes costly. In the case of the latter method, there are liable to entail problems such that the deposition rate upon the formation of the zinc oxide film is low, it is difficult for the layered structure comprising the zinc oxide thin film and the aluminum thin film to have a desirably high reflectivity, and it is difficult for a photovoltaic element obtained to have desirably high photovoltaic characteristics, particularly, a desirably high fill factor (F.F.).

SUMMARY OF THE INVENTION

The present invention is aimed at solving the foregoing problems in the prior art and providing a high quality and high performance photovoltaic element.

Another object of the present invention is to provide a photovoltaic element having an improved back reflecting layer comprising a metallic material having a high reflectivity against particularly light having a wavelength in the visible region and which stably and continuously exhibits desirable photovoltaic characteristics without being deteriorated even when reverse bias is applied under environmental conditions with high humidity.

A further object of the present invention is to provide a high performance photovoltaic element which is lightweight and flexible and which is usable as a solar cell which stably and continuously generates an electric power even when continuously used in outdoors over a long period of time.

BRIEF DESCRIPTION OF THE DRAWINGS

FIG. 8($b$) is a schematic view illustrating the constitution a light incident side portion of the photovoltaic element module (the solar cell module) shown in FIG. 8($a$).

FIG. 16 is a graph for a plurality of transparent and electrically conductive layers each having a light incident side surface region with a different cross section having a plurality of arcs arranged while being contacted with each other, each arc having a radius of curvature in the range of 500 Å to 3 $\mu$m and an angle of elevation from the center of the curvature in the range of 50 to 150°, and said cross section having a plurality of regions each based on a bisection of the arc which passes the center of the curvature and which is substantially perpendicular to the surface of a substrate on which the transparent and electrically conductive layer is formed at a given proportion (this proportion will be hereinafter referred to as [bisection region proportion]) and a plurality of photovoltaic elements (solar cells) each having one of the transparent and electrically conductive layers, said graph showing the interrelations between the bisection region proportions of the transparent and electrically conductive layers and the photoelectric conversion efficiencies of the photovoltaic elements.

DESCRIPTION OF THE INVENTION AND PREFERRED EMBODIMENTS

Figure 1:
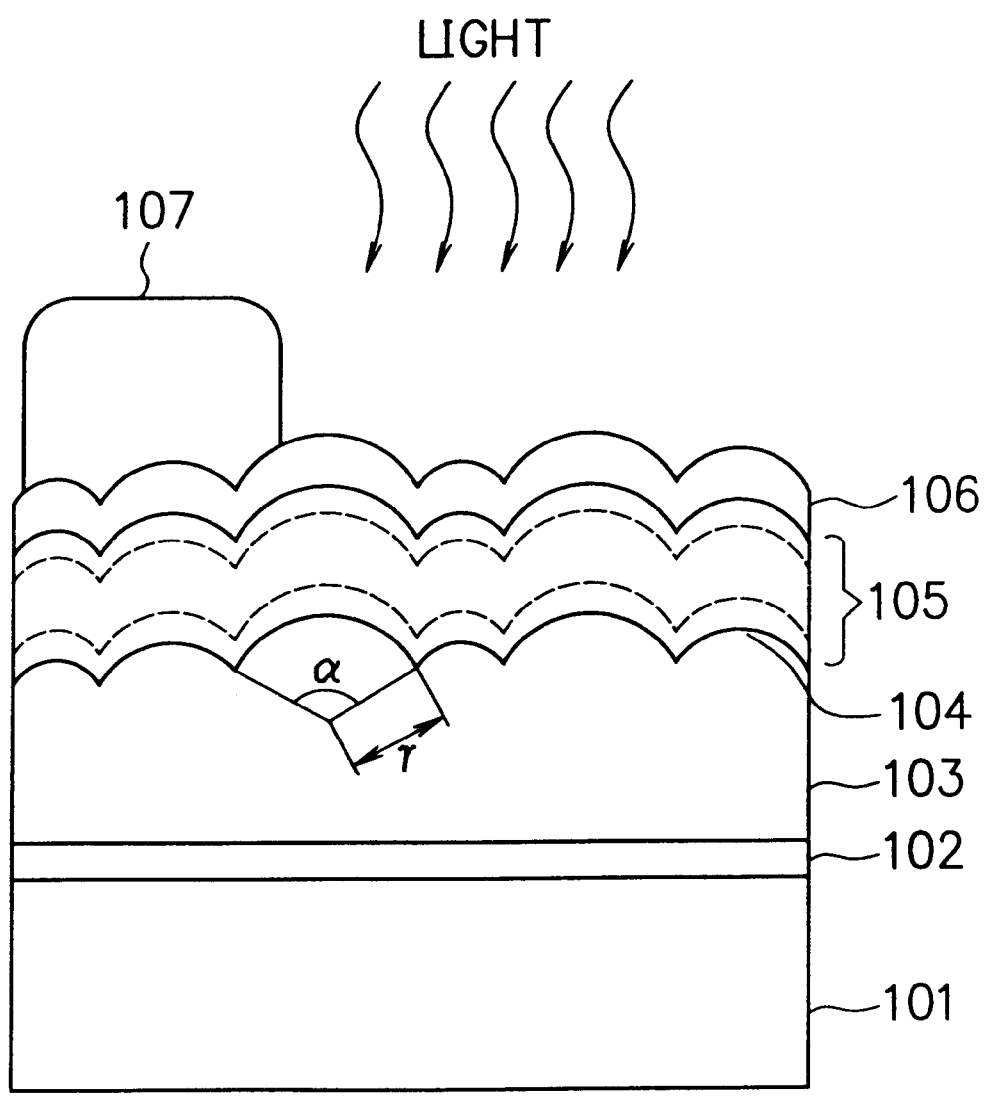
FIG. 1 is a schematic cross-sectional view illustrating the configuration of an example of a photovoltaic element (a solar cell) according to the present invention.

The present invention attains the above described objects.

A typical embodiment of a photovoltaic element (a solar cell) provided according to the present invention comprises a back reflecting layer comprising an aluminum based metallic material, a transparent and electrically conductive layer, a semiconductor layer comprising a non-single crystalline silicon semiconductor material (for instance, such as an amorphous silicon (a-Si) semiconductor material) containing hydrogen atoms and having at least a semiconductor junction (a pin junction), and an upper transparent electrode layer comprising a metal oxide material stacked in this order on a substrate, and a collecting electrode provided on said upper transparent electrode layer, wherein said transparent and electrically conductive layer comprises a zinc oxide material and has a light incident side surface region with a cross section having a plurality of arcs arranged while being contacted with each other, said arcs having a radius of curvature in the range of 300 Å to 6 μm and an angle of elevation from the center of the curvature in the range of 30 to 155°, and said cross section containing regions comprising said plurality of arcs at a proportion of 80% or more versus the entire region of the cross section.

The above described transparent and electrically conductive layer may have such layer constitution as will be described below. Typically, the transparent and electrically conductive layer has a two-layered structure comprising a first transparent and electrically conductive layer and a second transparent and electrically conductive layer stacked in this order on the substrate, wherein said first transparent and electrically conductive layer comprises an aggregation of zinc oxide crystal grains having regions whose c axis being parallel to the surface of the substrate at a proportion of 50 to 99% versus the entire region, and said second transparent and electrically conductive layer comprises an aggregation of prismatic zinc oxide crystal grains whose longitudinal direction being parallel to the zinc oxide's c axis and having regions in which said prismatic zinc oxide crystal grains are aggregated radiately to the direction perpendicular to the surface of the substrate at a proportion of 70% or more versus the entire region.

The thickness of the entire transparent and electrically conductive layer is in the range of 5000 Å to 3 μm. The first transparent and electrically conductive layer has a thickness corresponding to a proportion of 1 to 30% of the thickness of the entire transparent and electrically conductive layer.

The transparent and electrically conductive layer (including the case comprising the first and second transparent and electrically conductive layers) has a conductivity in the range of $10^{-8}$ (1/Ωcm) to $10^{-2}$ (1/Ωcm)

The first and second transparent and electrically conductive layers are preferably formed by means of sputtering, where each of these two layers is formed at a different film-forming temperature (that is, a different substrate temperature). Specifically, the first transparent and electrically conductive layer is formed at a substrate temperature in the range of 50 to 200° C., and the second transparent and electrically conductive layer is formed at a substrate temperature in the range of 150 to 400° C., where the substrate temperature for the formation of the second transparent and electrically conductive layer is necessary to be at least 30° C. higher than that for the formation of the first transparent and electrically conductive layer.

The formation of the first transparent and electrically conductive layer by means of sputtering is desired to be conducted in an atmosphere containing 50% or more of oxygen.

In the photovoltaic element according to the present invention, an intermediate layer comprising aluminum oxide may be interposed between the back reflecting layer and the transparent and electrically conductive layer. The intermediate layer may be a layer formed by means of reactive sputtering or a back oxide layer which is formed by subjecting the surface of the metal layer as the back reflecting layer to oxidation.

The present invention includes a photovoltaic element module (a solar cell module) by sealing the above described photovoltaic element with a sealing resin.

As a specific example of such module, there can be mentioned a photovoltaic element module (a solar cell module) obtained by resin-sealing an integrated body comprising a plurality of photovoltaic elements (solar cells) having the foregoing configuration being electrically connected with each other, by a surface side sealing member and a back side sealing member.

In the following, the present invention will be described in more detail while referring to the drawings.

FIG. 1 is a schematic cross-sectional view illustrating the configuration of an example of a photovoltaic element including a solar cell according to the present invention.

In FIG. 1, reference numeral 101 indicates a substrate comprising a material such as stainless steel, glass or the like and which serves to hold an element formed thereon. Reference numeral 102 indicate a back reflecting layer. The back reflecting layer 102 in this embodiment is constituted by a metallic material containing aluminum as a matrix (this metallic material will be hereinafter referred to as aluminum-based metallic material). The back reflecting layer 102 serves to return the light not absorbed by a semiconductor layer 105 into the semiconductor layer.

Reference numeral 103 indicates a transparent and electrically conductive layer. The transparent and electrically conductive layer 103 in this embodiment comprises zinc oxide. The transparent and electrically conductive layer 103 serves to scatter the light, and it also serves to prevent occurrence of a short-circuited defect. Reference numeral 104 indicates a light incident side surface of the transparent and electrically conductive layer 103.

The above described semiconductor layer 105 has at least a semiconductor junction such as pin junction or pn junction.

Reference numeral 106 indicates an upper transparent electrode (or an upper transparent electrode layer), and reference numeral 107 a collecting electrode.

As above described, an intermediate layer (not shown) may be interposed between the back reflecting layer 102 and the transparent and electrically conductive layer 103.

In the following, each of these constituents of the photovoltaic element.

Substrate

The substrate 101 may be either electrically or insulative, provided that it has an electrically conductive surface on which an element is to be formed.

The electrically conductive substrate may comprise an electrically conductive single body or an electrically conductive substrate having one or more electrically conductive thin films formed thereon.

The constituent of the electrically conductive substrate can include metals such as Hi, Cr, Fe, Al, Mo, Nb, Ta, V, Ti, and Rh; and alloys of these metals such as stainless steel and the like. Of these, Al and stainless steel are particularly preferable in terms of workability, strength, chemical stability, and cost.

The constituent of the electrically insulative substrate can include synthetic resins such as polyester, polyethylene, polycarbonate, cellulose acetate, polypropylene, polyvinyl chloride, polyvinylidene chloride, polystyrene, and polyamide. Besides, there can be mentioned glass, ceramics, papers, and the like.

In the case where the substrate is constituted by such insulative material, at a surface thereof on which an element is to be formed is necessary to be electrically conductive by providing an electrically conductive thin film thereon.

In any case, the formation of an electrically conductive thin film on the surface of the substrate may be conducted by means of vacuum evaporation, sputtering, screen printing, dip coating, or plasma CVD.

The substrate 101 may be of any configuration such a plate form, a sheet form, a belt-like form, or a cylindrical form, which can be properly determined depending upon the application uses.

The substrate 101 is desired to have a roughened surface, for instance, of Ra being 3.0 µm or less. Such roughened surface may be formed, for instance, by subjecting the surface of the substrate to surface etching treatment using an acidic solution of $HNO_3$, HF, HCl, or $H_2SO_4$.

For the thickness of the substrate 101, it should be properly determined so that a photovoltaic element (a solar cell) as desired can be formed.

In the case where flexibility is required for the photovoltaic element, the substrate can be made as thin as possible within a range capable of sufficiently providing the function as the support. However, the thickness of the substrate is usually made to be greater than 10 µm in view of fabrication and handling or mechanical strength of the substrate.

Further, the surface of the substrate 101 is desired to be cleaned by way of washing with a surfactant or an organic material in order to prevent the back reflecting layer and the transparent and electrically conductive layer formed thereon from peeling.

Back Reflecting Layer

The back reflecting layer 102 is typically constituted by an aluminum-based metallic material (including Al) as above described.

The back reflecting layer may be a single-layered structure or a multi-layered structure. In any case, the thickness is desired to be in the range of 100 to 5000 Å.

The back reflecting layer 102 may be formed by means of vacuum deposition or sputtering.

The surface of the back reflecting layer may be a flat surface or an irregular surface having a texture structure (this irregular surface will be hereinafter referred to as "textured-structure surface"). In the case where the back reflecting layer has a flat surface, it is desired for the back reflecting layer to be thinned as thinner as possible within a range capable of making the back reflecting layer to have a sufficient reflectivity.

In any case, when the internal stress is so large so that layer peeling is liable to occur, the thickness of the back reflecting layer is desired to be properly controlled.

In order to form the back reflecting layer so as to have a textured-structure surface, there can be employed, for instance, a method wherein the formation of a film as the back reflecting layer is conducted at a film-forming temperature (that is, a substrate temperature) in the range of 150 to 500° C., where the thickness of the film formed is controlled so as to have a desired irregular surface.

By the way, when a transparent and electrically conductive layer comprising zinc oxide is formed on such textured-structure surface of the back reflecting layer comprising an aluminum-based metallic material, the face of the former layer, which is contacted with the textured-structure surface of the latter layer, becomes a texture-structured face corresponding to the textured-structure surface of the latter layer, and there is obtained a stacked structure which can be expressed by the term back reflector. However, in many cases, this back reflector is of a reflectivity which is smaller than that of a stacked back reflector comprising a transparent and electrically conductive layer comprising zinc oxide formed on a flat surface of a back reflecting layer comprising an aluminum-based metallic material, where the former back reflector is inferior in its light reflecting performance.

For the reason why the former back reflector is inferior to the latter back reflector, it is considered that oxidation-reduction reaction has occurred between the zinc oxide of the texture-structured face of the transparent and electrically conductive layer and the aluminum-based metallic material of the textured-structure surface of the back reflecting layer, where the zinc oxide is reduced.

Therefore, in the case where zinc oxide is used as the transparent and electrically conductive layer, in general, it is desired not to use an aluminum film having a textured-structure surface formed at a film-forming temperature (a substrate temperature) of more than 150° C.

In order for the back reflecting layer 102 to have improved chemical stability, the back reflecting layer may contain one or more elements selected from the group consisting of Ti, Mn, Si, and Mo in an amount of 0.01 to 10 wt. %. However, the amount of these elements should be properly controlled in order not to decrease the reflectivity of the back reflecting layer.

Transparent and Electrically Conductive Layer

As previously described, the transparent and electrically conductive layer 103 is characterized by having a light incident side surface with a cross section having a plurality of arcs arranged while being contacted with each other, each arc having a radius of the curvature in the range of 300 Å to 6 µm and an angle of elevation from the center of the curvature in the range of 30 to 155°, and said cross section containing a plurality of regions each based on a bisection of the arc which passes the center of the curvature and which is substantially perpendicular to the surface of the substrate at a proportion of 80% or more versus the entire region of the cross section.

The light incident side surface of the transparent and electrically conductive layer has such a specific cross section has a plurality of arcs arranged while being contacted with each other as above described. Because of this, the transparent and electrically conductive layer has an excellent light collection efficiency.

Since the refractive index of a hydrogen-containing non-single crystalline silicon semiconductor layer (specifically, a hydrogen-containing amorphous silicon (a-Si:H) semiconductor layer) is in the range of about 3.3 to about 3.8, when (the average magnitude of the irregularities of the above described cross section)×(the refractive index of the semiconductor layer) is nearly equal to the wavelength of incident light, the incident light is efficiently scattered at the surface between the semiconductor layer and the transparent and electrically conductive layer (the surface is corresponding to the light incident side surface 104 in FIG. 1).

Further, the refractive index of zinc oxide (which is the constituent of the transparent and electrically conductive layer) is about 2.0. Thus, when (the average magnitude of the irregularities of the above described cross section)×(the refractive index of the zinc oxide) is nearly equal to the wavelength of incident light, the incident light is reflected by the back reflecting layer 102, then desirably scattered at the incident side surface 104.

The present inventor conducted experimental studies in order to establish a transparent and electrically conductive layer having a light incident side surface with a proper cross section having a plurality of arcs arranged while being contacted with each other. In the experimental studies, a plurality of transparent and electrically conductive layers comprising zinc oxide were formed by changing the film-forming conditions including the substrate temperature and the film-forming time. And using each transparent and electrically conductive layer, a plurality of photovoltaic elements were prepared as described in Example 1 which will be discussed later. For the resultant photovoltaic elements, evaluation was conducted with respect to photoelectric conversion efficiency. The obtained results are graphically shown in FIG. 10. Based on the results shown in FIG. 10, there were obtained findings as will be described in the following. In the case of using the transparent and electrically conductive layer having a light incident side surface with a cross section having a plurality of arcs arranged while being contacted with each other, said arcs having a radius of curvature in the range of 300 Å to 6 μm and an angle of elevation in the range of 30 to 155°, there is a large photoelectric conversion efficiency. When the radius of the curvature is in the range of 500 Å to 3 μm and the angle of elevation in the range of 50 to 150°, the photoelectric conversion efficiency is improved. When the radius of curvature is in the range of 900 Å to 2 μm and the angle of elevation in the range of 70 to 135°, the photoelectric conversion efficiency is more improved.

Then, as a result of examining the proportion of such regions in the entire cross section, there were obtained results as graphically shown in FIG. 16. Based on the results shown in FIG. 16, it was found that when the above proportion is 80% or more, there is a satisfactory photoelectric conversion efficiency. The results shown in FIG. 16 are based on the radius of curvature in the range of 500 Å to 3 μm and the angle of elevation in the range of 50 to 150°.

The term the above proportion is 80% or more means that the transparent and electrically conductive layer has a light incident side surface region with a cross section having a plurality of arcs arranged while being contacted with each other, each arc having a radius of curvature in the range of 500 Å to 3 μm and an angle of elevation from the center of the curvature in the range of 50 to 150°, and said cross section having a plurality of regions each based on a bisection of the arc which passes the center of the curvature and which is substantially perpendicular to the surface of the substrate on which the transparent and electrically conductive layer is formed at a proportion of 80% or more versus the entire region of the cross section.

When the transparent and electrically conductive layer having such cross sectional pattern is viewed from the light incident side, it has substantially no ridge line, different from a conventional zinc oxide film having a pyramid-like structure comprising a plurality of cross-sectional patterns contacted with each other and which has a textured-structure surface. Because of this, a photovoltaic element in which the transparent and electrically conductive layer is used has an improved open-circuit voltage.

In the case of a transparent and electrically conductive layer having a ridge line region, the thickness of a layer region formed on the ridge line region is liable to be greater than that of other layer region formed on the remaining region. And for a photovoltaic element in which such transparent and electrically conductive layer is used, the open-circuit voltage is lowered only for said locally thickened region, resulting in a decrease in the open-circuit voltage of the photovoltaic element as a whole.

On the other hand, in the present invention, because the transparent and electrically conductive layer is substantially free of ridge line as described above, the open-circuit voltage of the photovoltaic element as a whole is high.

Further, in the present invention, the transparent and electrically conductive layer is smaller than a conventional transparent and electrically conductive layer in terms of the number of valley lines. This also leads to improving the open-circuit voltage of the photovoltaic element.

In a valley region, film deposition is usually difficult to achieve. This, the film formed in such valley region is locally thinned, and leakage current is liable to occur at such locally thinned small region, resulting in a decrease in the open-circuit voltage of the photovoltaic element as a whole. On the other hand, in the present invention, such valley region is slight and therefore, the decrease in the open-circuit voltage due to the valley region is slight.

In addition, in the present invention, the transparent and electrically conductive layer is highly textured as described above, and because of this, light interference has substantially not occurred in the semiconductor layer. Thus, the inside of the semiconductor layer is substantially free of a portion where light is locally absorbed, and because from this, the probability for photo hole electron pair to be recombined is not increased. This situation results in an improvement in the fill factor (F.F.) of the photovoltaic element. And since the probability for photo hole electron pair to be recombined is small, the photovoltaic element is prevented from degradation due to light.

In addition, because of using the transparent and electrically conductive layer having such specific cross section comprising a plurality of arcs arranged while being contacted with each other as above described, the photovoltaic element has sufficient durability which can endure against an external force applied from any direction.

Further, the external stress at the time of forming a zinc oxide film as the transparent and electrically conductive layer can be reduced, and therefore, the transparent and electrically conductive layer hardly suffers from layer peeling.

Since the back reflecting layer, which is situated under the transparent and electrically conductive layer, is constituted by aluminum, different from a metal such as Ag or Cu which is liable to cause migration, even when reverse bias is applied to the photovoltaic element, the characteristics thereof are not deteriorated.

By making the transparent and electrically conductive layer thickness in the range of 5000 Å to 3 μm, it is possible to prevent the photovoltaic element from having a short-circuit defect. And the production cost of a photovoltaic element which is produced using a zinc oxide film can be reduced. Furthermore, in the case of producing a photovoltaic element by a roll-to-roll film-forming apparatus, even when the photovoltaic element obtained is stored in a roll-like wound state over a long period of time, surface cracking of the zinc oxide film of the photovoltaic element does not occur and there is no short-circuit defect in the photovoltaic element during the long time storage.

Figure 12:
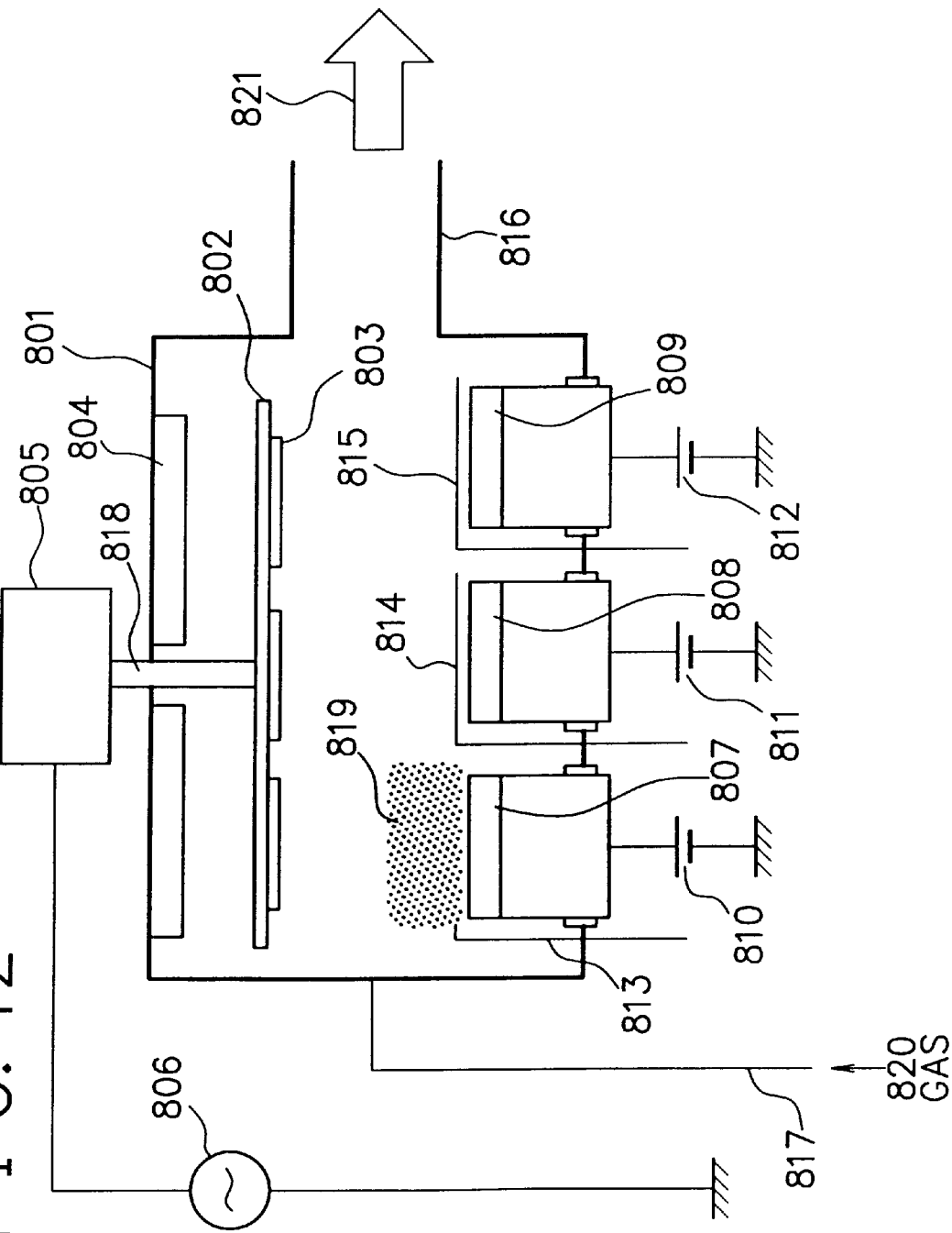
FIG. 12 is a schematic diagram illustrating the constitution of an example of a film-forming apparatus which is used for the formation of a back reflecting layer and a transparent and electrically conductive layer in the production of a photovoltaic element (a solar cell) of the present invention.

FIG. 12 is a schematic diagram illustrating an example of a film-forming apparatus which enables to continuously form the back reflecting layer 102 and the transparent and electrically conductive layer 103.

In FIG. 12, reference numeral 801 indicates a cylindrical deposition chamber, reference numeral 802 a circular substrate holder, reference numeral 803 a substrate, reference numeral 804 a heater, reference numeral 805 a matching box (including a matching circuit), and reference numeral 806 an RF power source.

Reference numeral 807 indicates a target for the formation of a back reflecting layer, reference numeral 808 a target for the formation of a first transparent and electrically conductive layer, reference numeral 809 a target for the formation of a second transparent and electrically conductive layer, and each of reference numerals 810, 811 and 812 a DC power source. Each of reference numerals 813, 814 and 815 indicates a shutter, reference numeral 816 an exhaust pipe connected to an exhaust device comprising, for instance, an oil diffusion pump and a rotary pump (not shown), reference numeral 817 a gas feed pipe extending from a gas supply system (not shown), and reference numeral 818 a rotary shaft as a central axis of the circular substrate holder 802.

Reference numeral 819 indicates a plasma generated upon film formation. Reference numeral 820 indicates the direction for a gas fed into the deposition chamber 801 through the gas feed pipe 817. Reference numeral 812 is an arrow mark indicating the direction of evacuation.

Description of film formation in the film-forming apparatus shown in FIG. 12 follows.

Upon the film formation, the substrate holder 802 having a substrate 803 for film formation positioned thereon is rotated at a revolution speed of 0.1 to 2 times per one minute through the rotary shaft 818. The substrate 803 is heated to a temperature of 100 to 250° C. at the time of commencing film formation, followed by gradually raising the temperature of the substrate. The maximum substrate temperature (that is, the film-forming temperature) is desired to be 400° C. or less.

The revolution speed of the substrate holder 802 and the raising speed of the substrate temperature depend on the thickness of a layer formed and the magnitude of the sputtering power, and therefore, these parameters should be properly adjusted depending on the situation involved.

As described above, the maximum substrate temperature (the film-forming temperature) is desired to be 400° C. or less. This is because in the case of forming a zinc oxide film by means of sputtering, the deposition rate is decreased and the throughput is decreased as the substrate temperature is increased.

In the present invention, the transparent and electrically conductive layer 103 is desired to have a conductivity in the range of $10^{-8}$ (1/Ωcm) to $10^{31\ 2}$ (1/Ωcm) for the following reasons.

That is, when the transparent and electrically conductive layer 103 is of an extremely low conductivity, the series resistance of the photovoltaic element is increased to result in a reduction in the photoelectric conversion efficiency. Thus, it is necessary for the transparent and electrically conductive layer to have a large conductivity in order not to cause an increase in the series resistance.

In addition, the production of a photovoltaic element is usually conducted in a clean atmosphere, where somewhat leakage paths are unavoidably present. Therefore, even in the case where the generation density of such leakage paths is small, in order to prevent a large quantity of electric current from flowing from the leakage paths, the conductivity of the transparent and electrically conductive layer must be small. When the conductivity of the transparent and electrically conductive layer is excessively large, the shunt resistance in the photoconductive characteristics becomes small (a weakly short-circuited state), resulting in a reduction in the photoelectric conversion efficiency.

However, specific numerical range of the conductivity of the transparent and electrically conductive layer chiefly depends on the photoconductive characteristics (including series resistance) and the density of leakage path of a given photovoltaic element which is of good quality.

In this respect, the present inventor conducted experimental studies, where a plurality of photovoltaic elements were prepared in the same manner as in Example 1 which will be described later, and for the resultant photovoltaic elements, an examination was conducted of the interrelations between the conductivity of the transparent and electrically conductive layer used in each photovoltaic element and the photoelectric conversion efficiency of the photovoltaic element.

The transparent and electrically conductive layer used in each photovoltaic element was formed by means of sputtering, where a target comprising aluminum oxide embedded in the surface of a zinc oxide target was used, and the two components were sputtered together to form a zinc oxide film incorporated with aluminum (Al) as the transparent and electrically conductive layer. Herein, the more Al was added, the higher the conductivity of the zinc oxide film as the transparent and electrically conductive layer became.

Figure 11:
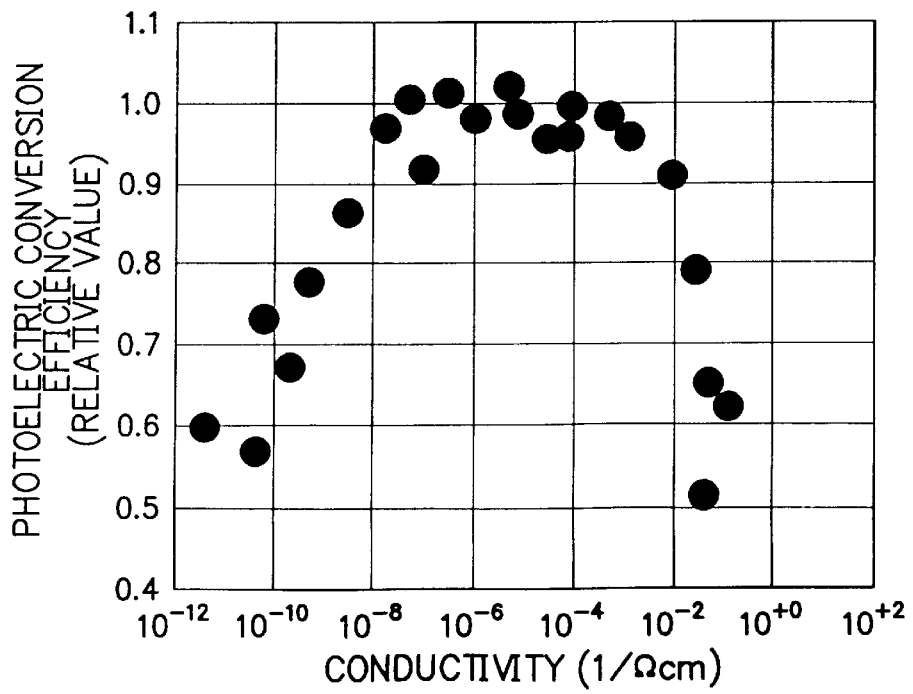
FIG. 11 is a graph for transparent and electrically conductive layers having a different conductivity and photovoltaic elements (solar cells) each having one of the transparent and electrically conductive layers, showing the interrelations among the conductivities of the transparent and electrically conductive layers and the photoelectric conversion efficiencies of the photovoltaic elements (the solar cells).

The examined results are graphically shown in FIG. 11. Based on the examined results shown in FIG. 11, there when the transparent and electrically conductive layer conductivity is less than $10^{-8}$ (1/Ωcm), the series resistance in the photoconductive characteristics of the photovoltaic element is excessively large, resulting in a decrease in the photoelectric conversion efficiency; and when the transparent and electrically conductive layer conductivity is greater than $10^{-2}$ (1/Ωcm), the shunt resistance is excessively small, resulting in a decrease in the photoelectric conversion efficiency.

Transparent and Electrically Conductive Layer Having a Stacked Structure

As previously described, the transparent and electrically conductive layer in the present invention may be of a stacked structure. Specific examples of such stacked structures, can be the two-layered structures shown in FIGS. 2 and 4.

Figure 2:
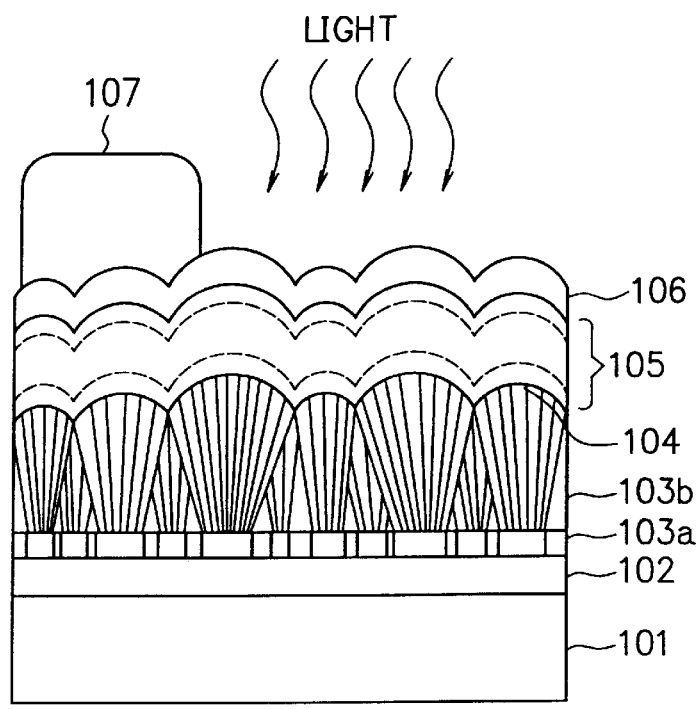
FIG. 2 is a schematic cross-sectional view illustrating the configuration of another example of a photovoltaic element (a solar cell) according to the present invention.
Figure 4:
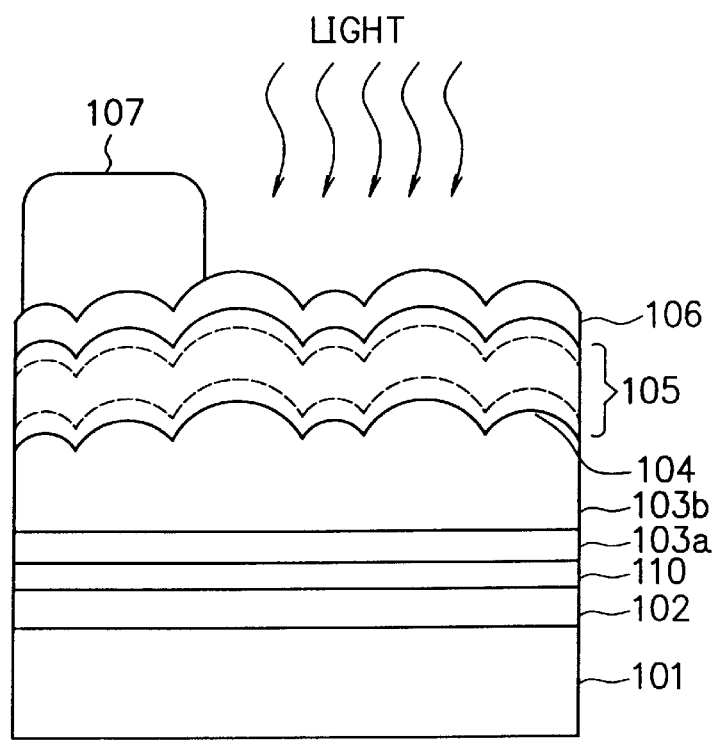
FIG. 4 is a schematic cross-sectional view illustrating the configuration of a further example of a photovoltaic element (a solar cell) according to the present invention.

The transparent and electrically conductive layer having such two-layered structure as shown in FIG. 2 or 4 comprises a first transparent and electrically conductive layer 103a and a second transparent and electrically conductive layer 103b stacked in this order from the side of the substrate 101. The first transparent and electrically conductive layer 103a comprises an aggregation of zinc oxide crystal grains having regions whose c axis is parallel to the surface of the substrate at a proportion of 50 to 99% versus the entire region, and the second transparent and electrically conductive layer 103b comprises an aggregation of prismatic zinc oxide crystal grains whose longitudinal direction is parallel to the zinc oxide's c axis and having regions in which said prismatic zinc oxide crystal grains are aggregated radiately to the direction perpendicular to the surface of the substrate at a proportion of 70% or more versus the entire region. In the structural body thus configured, the uniformity of zinc oxide is improved.

Conventional members comprising a zinc oxide single layer formed on an aluminum thin film, when the surfaces of their zinc oxide single layers are carefully observed by an electron microscope, often have pinholes of about 1000 Å in diameter.

On the other hand, the two-layered transparent and electrically conductive layer comprising zinc oxide in the present invention, the rate of pinhole occurrence was found to be less than 1% versus that of the single zinc oxide layer. This small rate of pinhole occurrence leads to a significantly improved the yield of a photovoltaic element. And the photovoltaic element is desirably small in leakage current and because of this, the element has an improved open-circuit voltage.

In the case where a photovoltaic element is continuously produced by means of roll-to-roll film-forming system, followed by conducting a series connection or a parallel connection to obtain a photovoltaic element module, the photovoltaic element must be cut into a plurality of photovoltaic elements of equal size. At this time, it is difficult to prevent of layer peeling at the microscopic level.

However, by using the two-layered transparent and electrically conductive layer according to the present invention, the area of the region where such layer peeling has occurred can be decreased to less than a few percent.

For this reason, it is considered that the zinc oxide crystal grains in the present invention are larger than the conventional zinc oxide crystal grains; the first transparent and electrically conductive layer 103a has an improved adhesion with the back reflecting layer 102; and the radiately extended zinc oxide crystal grains in the second transparent and electrically conductive layer 103b relax internal stress.

In the present invention, in the case of forming the first transparent and electrically conductive layer 103a by means of sputtering, by conducting its formation at a substrate temperature in the range of 50 to 200° C., it is possible to form a transparent and electrically conductive zinc oxide film comprising an aggregation of zinc oxide crystal grains having regions whose c axis is parallel to the surface of the substrate at a proportion of 50 to 99% versus the entire region, as the first transparent and electrically conductive layer 103a.

In this case, when aluminum is incorporated into the above zinc oxide film, its conductivity is improved, and the c axis orientation against the direction perpendicular to the surface of the substrate is decreased to enable the c axis to readily become parallel to the surface of the substrate. Hence, incorporation of aluminum is preferable. This advantage is also provided in the configuration shown in FIG. 3 in which an intermediate layer 110 comprising aluminum oxide is interposed between the back reflecting layer 102 and the transparent and electrically conductive layer 103, where the c axis orientation against the direction perpendicular to the surface of the substrate is decreased to enable the c axis to readily become parallel to the surface of the substrate.

For the second transparent and electrically conductive layer 103b, as shown in FIG. 2, it is desired to be such that the zinc oxide crystal grains are radiately aggregated from a portion where the c axis of the first transparent and electrically conductive layer 103a and their regions are of a proportion of 70% or more versus the entire region.

In the case of forming the first and second transparent and electrically conductive layers 103a and 103b, it is desired that the substrate temperature at the time of forming the second transparent and electrically conductive layer is in the range of 150 to 400° C., being at least 30° C. higher than the substrate temperature at the time of forming the first transparent and electrically conductive layer. In this case, the c axis orientation is improved to make the second transparent and electrically conductive layer have a cross section containing a plurality of arcs arranged while in contact with each other at a proportion of more than 90% versus the entire region. Thus, by making the substrate temperature for the formation of the second transparent and electrically conductive layer higher than that for the formation of the first transparent and electrically conductive layer, it is possible to make the crystallinity and orientation of one of the two layers to be different from those of the other layer. This situation enables to establish the above described cross-sectional pattern containing a plurality of arcs arranged while in contacted with each other with a good level of reproducibility.

In addition, when the formation of the first transparent and electrically conductive layer by means of sputtering is conducted in an atmosphere containing 50% or more oxygen, there are provided such advantages as will be described in the following. That is, at a stage when the transparent and electrically conductive layer comprising zinc oxide is formed on the back reflecting layer formed on the substrate, the resultant stacked body has a sufficiently high reflectivity against light having a wavelength of 500 to 1000 nm which is impinged from the side of the transparent and electrically conductive layer and it has a highly textured surface structure. This situation effectively improves the short-circuit photo current of the photovoltaic element.

In the prior art, when a back reflecting layer whose principal constituent is aluminum and a transparent and electrically conductive layer comprising zinc oxide are continuously formed in this order on a substrate in a vacuumed atmosphere, the resultant stacked body is inferior in reflectivity of the visible light with a wavelength of 400 to 800 nm. Therefore, it is considered that the zinc oxide of the transparent and electrically conductive layer is reduced by the reduction action of the aluminum of the back reflecting layer to form an ultra thin film rich in zinc at the interface between the back reflecting layer and the transparent and electrically conductive layer.

In the present invention, by conducting the formation of the first transparent and electrically conductive layer in an atmosphere containing 50% or more of oxygen, the zinc oxide as the constituent thereof is effectively prevented from being reduced. And by this, the resulting transparent and electrically conductive layer has such a desirable cross-sectional pattern as described above. The reason for this is not clear enough at the present time, but it is considered that active species relating to oxygen in the plasma state affect the process of forming zinc oxide decreasing the c axis orientation.

Furthermore, when the thickness of the first transparent and electrically conductive layer is 1 to 30% of the thickness of the entire transparent and electrically conductive layer (that is, the first and second transparent and electrically conductive layers), by means of sputtering, it is possible to form a transparent and electrically conductive thin film having a highly textured surface as the first transparent and electrically conductive layer with a good level of reproducibility. That is, when the first transparent and electrically conductive layer, namely, a layer containing zinc oxide crystal grains whose c axis is parallel to the surface of the substrate in an amount corresponding to more than half of the constituent of said layer, is used over the entire region of the transparent and electrically conductive layer, the layer becomes low in terms of the texture degree. In the case where the second transparent and electrically conductive layer whose c axis is perpendicular to the surface of the substrate is used over the entire region, the layer becomes to be low in terms of the texture degree. In order to form such cross-sectional pattern as described above with a good level of reproducibility, the second transparent and electrically conductive layer whose c axis is perpendicular to the surface of the substrate, should be grown at a relatively large thickness based on crystalline nucleus comprising zinc oxide crystal grains of the first transparent and electrically conductive layer.

Furthermore, by making the first and second transparent and electrically conductive layer conductivity to be in the range of $10^{-8}$ (1/Ωcm) to $10^{-2}$ (1/Ωcm), even when pinholes which have been occurred at the time of forming the semiconductor layer comprising a non-single crystalline silicon material are present to a certain extent, the characteristics of the photovoltaic element are not substantially hindered by those pinholes. This situation leads to a significantly improved yield of a photovoltaic element.

Formation of Back reflecting Layer and Transparent and Electrically Conductive Layer Using the previously described film-forming apparatus shown in FIG. 12, the back reflecting layer 102 and the transparent and electrically conductive layer 103 (the first and second transparent and electrically conductive layers 103a and 103b) may be desirably formed, for instance, in the following manner.

A substrate 803 which has been well-cleaned by way of acid washing or organic washing is fixed onto the surface of the circular substrate holder 802. The rotary shaft 818 rotates the substrate holder 802. Then, using an exhaust device comprising an oil diffusion pump/a rotary pump (not shown), the inside of the deposition chamber 801 is evacuated to about $5 \times 10^{-6}$ Torr. Ar gas is introduced into the deposition chamber 801 through the gas feed pipe 817, and an RF power from the RF power source 806 is supplied into the deposition chamber 801 through the matching box 805, causing Ar plasma, where the matching box is regulated to minimize reflected power. In this case, the exposed surface of the substrate 803 is subjected to sputter-etching with the Ar plasma to be a more-cleaned surface. After this, by means of the heater 804, the substrate 803 is heated to and maintained at a predetermined temperature suitable for the formation of a back reflecting layer. Then, the DC power source 810 is actuated, Ar plasma 819 is generated, the shutter 813 is opened, where the target 807 for the formation of a back reflecting layer is sputtered by the Ar plasma to form a back reflecting layer at a desired thickness on the substrate 803. After this, the shutter 813 is closed and the DC power source 810 is switched off.

Then, the temperature of the substrate 803 is adjusted to and maintained at a predetermined temperature suitable for the formation of a first transparent and electrically conductive layer 103a by regulating the heater 804. After this, the DC power source 811 is actuated, Ar plasma is generated, and the shutter 814 is opened, where the target 808 for the formation of a first transparent and electrically conductive layer 103a is sputtered by the Ar plasma to form a first transparent and electrically conductive layer 103a at a desired thickness on the back reflecting layer 102. After this, the shutter 814 is closed and the DC power source 811 is switched off.

Then, the temperature of the substrate 803 is adjusted to and maintained at a predetermined temperature suitable for the formation of a second transparent and electrically conductive layer 103b by regulating the heater 804. After this, the DC power source 812 is actuated, Ar plasma is generated, and the shutter 815 is opened, where the target 809 for the formation of a second transparent and electrically conductive layer 103b is sputtered by the Ar plasma to form a second transparent and electrically conductive layer 103b at a desired thickness on the first transparent and electrically conductive layer 103a. After this, the shutter 815 is closed and the DC power source 812 is switched off.

Intermediate Layer

The intermediate layer 110 (see, FIGS. 3 and 4) comprises aluminum oxide in this embodiment. The intermediate layer 110 is interposed between the back reflecting layer and the transparent and electrically conductive layer 103 (see, FIG. 3) or the two-layered transparent and electrically conductive layer comprising the first and second transparent and electrically conductive layers 103a and 103b (see, FIG. 4).

The intermediate layer 110 functions to prevent the transparent and electrically conductive layer comprising zinc oxide from being reduced and to prevent its transparency from deteriorating.

By providing the intermediate layer, the foregoing stacked body comprising the transparent and electrically conductive layer formed on the back reflecting layer having a reflectivity against light having a wavelength in the range of 500 to 1000 nm can be made such that said reflectivity is significantly improved.

The presence of the intermediate layer comprising aluminum oxide somewhat increases the series resistance of the photovoltaic element but this does not result in a decrease in the photoelectric characteristics of the element.

In addition, the presence of the intermediate layer comprising aluminum oxide desirably improves the cross-sectional pattern of the transparent and electrically conductive layer. Therefore, it is considered such that the presence of the intermediate layer depresses the c axis orientation of the transparent and electrically conductive layer, particularly, of the first transparent and electrically conductive layer, to increase those becoming parallel to the surface of the substrate, improving the cross-sectional pattern.

The intermediate layer is desired to have a thickness in the range of 10 to 1000 Å. In the case where the thickness is less than 10 Å, the film as the intermediate layer becomes an island-like state, where the foregoing effects are liable to reduce. In the case where the thickness is grater than 1000 Å, there is a tendency that the series resistance of the photovoltaic element is increased, resulting in a decrease in the photovoltaic characteristics of the element.

The intermediate layer may be formed by means of sputtering. Particularly, when the intermediate layer is formed in a reactive sputtering film-forming manner, wherein an aluminum target is sputtered in an atmosphere containing 80% or more oxygen, the cross-sectional pattern of the transparent and electrically conductive layer is further improved.

Alternatively, the intermediate layer may comprise a surface oxide layer formed by subjecting the surface of a metal layer comprising an aluminum-based metallic material as the back reflecting layer to surface oxidation treatment in an atmosphere containing more than 80% oxygen. In this case, the surface oxide layer comprises alumina which is transparent, and therefore, the layer never decreases the reflectivity.

Semiconductor Layer

The semiconductor layer 105 (or the semiconductor active layer) is very important for a photovoltaic element, because it governs its photoelectric characteristics including photoelectric conversion efficiency, open-circuit voltage, and short-circuit photo current.

The semiconductor 105 is constituted by a non-single crystalline silicon semiconductor material. The semiconductor layer may be structured to comprise a single cell having a pin junction or a pn junction or a plurality of pin junction cells having a pin junction or a pn junction being stacked. The cell having a pin junction will be hereinafter referred to as a pin junction cell, and the cell having a pn junction will be hereinafter referred to as a pn junction cell.

Besides, depending upon the situation, the semiconductor layer may comprise a pn junction cell stacked on a pin junction cell.

The non-single crystalline silicon semiconductor material that constitutes the semiconductor layer 105 can include amorphous silicon (a-Si) series semiconductor materials, microcrystalline silicon ($\mu$c-Si) series semiconductor materials, and polycrystalline silicon (poly-Si) series semiconductor materials. Specific examples of such semiconductor material are a-Si, a-SiGe, a-SiSn, a-SiC, a-SiO, a-SiN, $\mu$c-Si, $\mu$c-SiC, and poly-Si.

These semiconductor materials may be of p-type, formed by adding an appropriate element capable of imparting a p-type property (this element will be hereinafter referred to as a p-type dopant). The p-type dopant can include B, Al or the like. Similarly, these semiconductor materials may be of an n-type, formed by adding an appropriate element capable of imparting an n-type property (this element will be hereinafter referred to as a n-type dopant). The n-type dopant can include P, As, Sb or the like.

It is necessary for the a-Si or $\mu$c-Si series semiconductor materials to contain at least H or/and a halogen element such as F, Cl, or the like in order to compensate a defect such as a dangling bond present therein.

The pin junction cell of the semiconductor layer may comprise an n-type semiconductor layer/an i-type semiconductor layer/a p-type semiconductor layer stacked in this order from the substrate side or a pin junction cell comprising a p-type semiconductor layer/an i-type semiconductor layer/an n-type semiconductor layer stacked in this order from the substrate side.

As described above, the semiconductor layer 105 may comprise one of such pin junction cells. However, in order to prevent the photovoltaic element from light degradation (a phenomena, in which the fill factor and open-circuit voltage are gradually decreased due to continuous irradiation of light having a strong intensity over a long period of time, where the photoelectric conversion efficiency is gradually decreased), the semiconductor layer 105 preferably comprises comprise two or more such pin junction cells being stacked.

In the case where the pn junction cell, the semiconductor layer may be of a configuration comprising an n-type semiconductor layer-a p-type semiconductor layer/an n-type semiconductor layer-an i-type semiconductor layer-a p-type semiconductor layer being stacked in this order from the substrate side or a configuration comprising a p-type semiconductor layer-an n-type semiconductor layer/a p-type semiconductor layer-an i-type semiconductor layer-an n-type semiconductor layer being stacked in this order from the substrate side.

Figure 9:
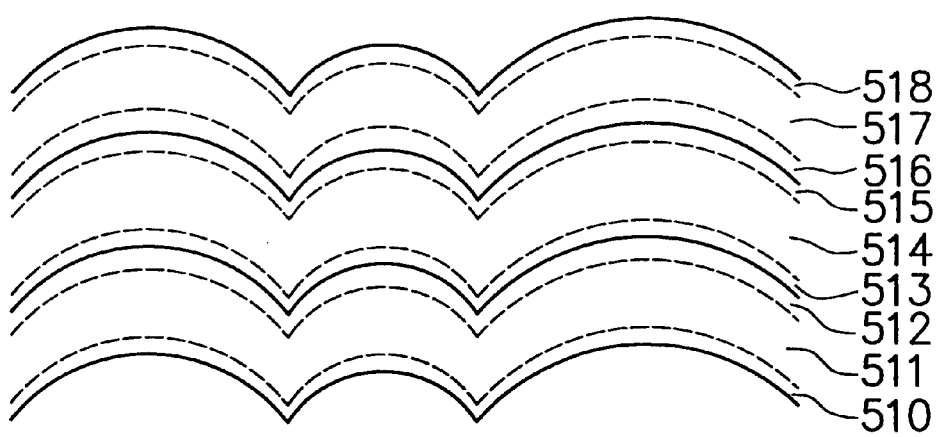
FIG. 9 is a schematic cross-sectional view illustrating the configuration of an example of a semiconductor layer in a photovoltaic element (a solar cell) according to the present invention.

FIG. 9 is a schematic cross-sectional view illustrating the configuration of a specific embodiment of the semiconductor layer. The semiconductor layer shown in FIG. 9 has a triple cell structure which comprises a first pin junction cell comprising an n-type semiconductor layer 510, an i-type semiconductor layer 511 and a p-type semiconductor layer 512/a second pin junction cell comprising an n-type semiconductor layer 513, an i-type semiconductor layer 514 and a p-type semiconductor layer 515/a third pin junction cell comprising an n-type semiconductor layer 516, an i-type semiconductor layer 517 and a p-type semiconductor layer 518.

In this embodiment, the i-type semiconductor layer 511 in the first cell comprises a-SiGe:H, the i-type semiconductor layer 514 in the second cell comprises a-SiGe:H, and the i-type semiconductor layer 517 in the third cell comprises a-Si:H. In this embodiment, any of the three i-type semiconductor layers comprises a single-layered structure as described above. This is not a limiting structure. Any of the three i-type semiconductor layers may comprise a multi-layered structure comprising, for instance, a-SiGe/a-Si or a-Si/a-SiGe/a-Si.

In any case, in order for the i-type semiconductor layer to be more intrinsic, it is possible to add B or the like to the i-type semiconductor layer.

In order to form a pn junction structure, it is desired to use poly-Si series materials or $\mu$c-Si series materials which are added with any of the foregoing elements capable of imparting an n-type or a p-type property. The semiconductor layer comprising any of these materials is usually slight in terms of the foregoing light degradation and is suitable when used outdoors over a long period of time. However, these polycrystalline or microcrystalline materials have a visible light absorption coefficient which is smaller than those of a-Si series materials, and therefore, the thickness of the semiconductor layer comprising such polycrystalline or microcrystalline material must be greater than 1 $\mu$m.

The n-type and the p-type semiconductor layers should, preferably, comprise a semiconductor material which is as small as possible with respect to light absorption. As such material, there is usually used a-Si, a-SiC, a-SiO, a-SiN, $\mu$c-Si, $\mu$c-SiC, or poly-Si.

The formation of a pin junction cell comprising a non-single crystalline silicon material (including a-Si, a-SiC, a-SiO, a-SiN, $\mu$c-Si, and $\mu$c-SiC) may be conducted by means of plasma CVD. Specifically, the i-type semiconductor layer is preferably to be formed by means of microwave plasma CVD which is high in terms of the deposition rate. The formation of a given semiconductor layer comprising poly-Si may be conducted by forming an a-Si film by plasma CVD or sputtering, followed by subjecting it to treatment with the irradiation of laser or the application of high frequency power.

The foregoing pin junction cell may be based on a combination of a microcrystalline silicon series semiconductor material and an amorphous silicon series semiconductor material. Particularly, when the p-type semiconductor layer comprises a $\mu$c-Si or $\mu$c-SiC material, the photocarrier density in the p-type semiconductor layer is increased to result in an improvement in the open-circuit voltage of the photovoltaic element. Furthermore, a $\mu$c-Si or a $\mu$c-SiC material has a visible light absorption coefficient smaller than that of an a-Si material. In this respect, when the $\mu$c-Si or $\mu$c-SiC material is used as the window layer on the light incident side, the short-circuit photo current is increased.

The semiconductor layer 105 may contain a band gap-adjusting element. For instance, when Ge as the band gap-adjusting element is incorporated into the i-type semiconductor layer, it is possible to make the semiconductor layer with a small band gap. This increases the short-circuit photo current in the photovoltaic element. In the case of a photovoltaic element comprising two or more pin junction cells being stacked, it is desired for such i-type semiconductor layer to be used as the i-type semiconductor layer of the bottom pin junction cell position on the back reflecting layer side.

Besides, the i-type semiconductor layer may contain at least an element selected from the group consisting of O, N and C. In this case, the i-type semiconductor layer will have a large band gap. In the case of a photovoltaic element comprising two or more pin junction cells being stacked, it is desired for such i-type semiconductor layer to be used as the i-type semiconductor layer of the top pin junction cell position on the light incident side.

In the case of a triple cell photovoltaic element having three pin junction cells, when the two i-type semiconductor layers of the two pin junction cells positioned on the back reflecting layer side are incorporated with Ge, the collection efficiency of light having a wavelength in the range of 300 to 1000 nm is significantly improved.

Formation of Semiconductor Layer

Figure 13:
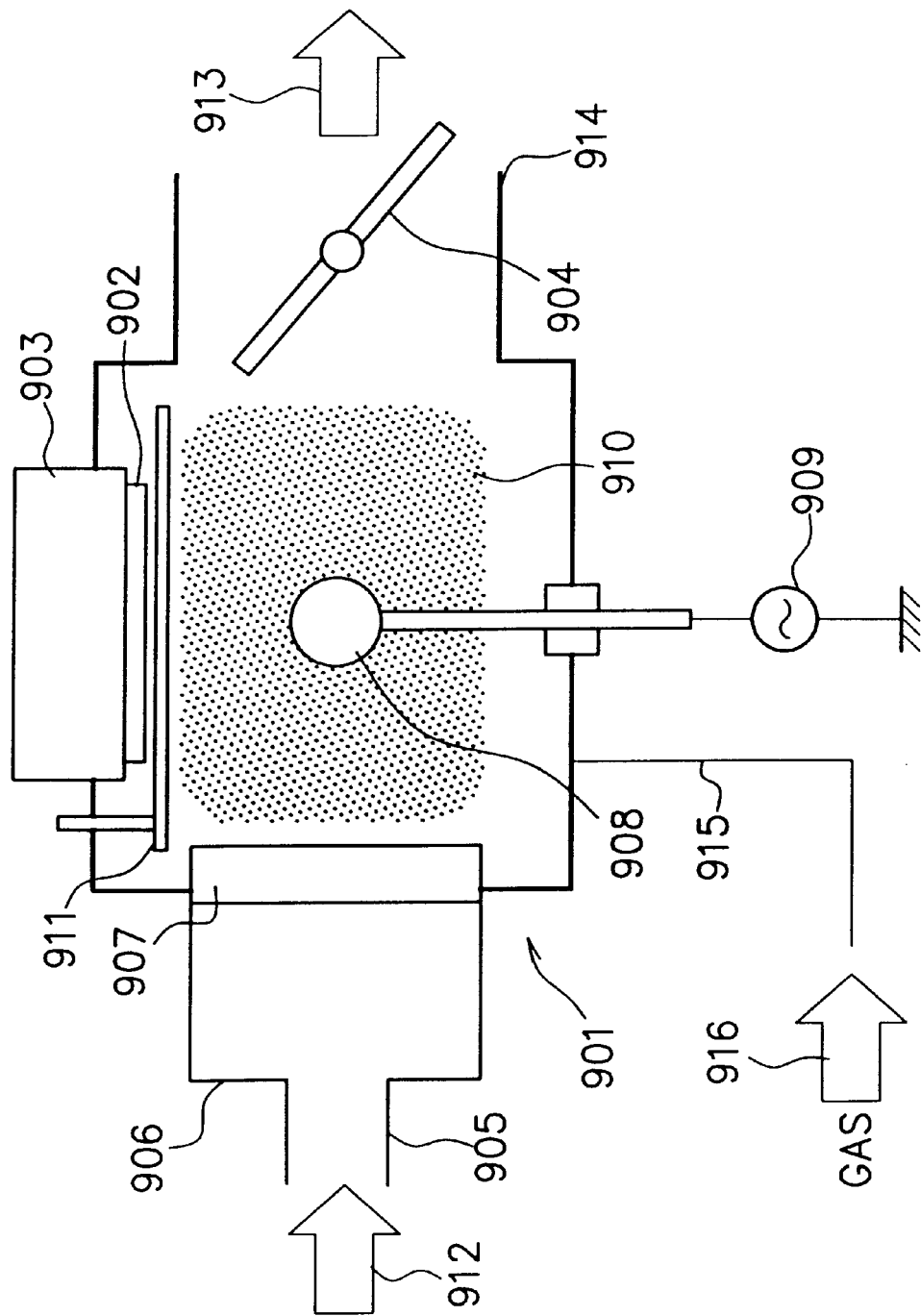
FIG. 13 is a schematic diagram illustrating the constitution of an example of a film-forming apparatus which is used for the formation of a semiconductor layer in the production of a photovoltaic element (a solar cell) of the present invention.

The semiconductor layer in a photovoltaic element according to the present invention may be formed using a plasma CVD film-forming apparatus, for instance, of the constitution shown in FIG. 13.

In FIG. 13, reference numeral 901 indicates a reaction chamber, reference numeral 902 a substrate having a back reflecting layer and a transparent and electrically conductive layer formed in this order thereon, reference numeral 903 a substrate holder provided with a heater (not shown), reference numeral 904 a conductance valve, reference numeral 905 a microwave waveguide extending from a microwave power source (not shown), reference numeral 906 a microwave introduction portion, reference numeral 907 a microwave introduction window made of alumina ceramics, reference numeral 908 an RF power introduction portion, and reference numeral 909 an RF power source having a matching circuit therein.

Reference numeral 910 indicates plasma, reference numeral 911 a shutter, reference numeral 914 an exhaust pipe connected to a vacuum pump comprising an oil diffusion pump or the like (not shown), and reference numeral 915 a raw material gas feed pipe extending from a gas supply system (not shown) having raw material gas reservoirs (not shown). Reference numeral 912 indicates a direction for a microwave to propagate, reference numeral 913 an evacuation direction, and reference numeral 916 a direction in which raw material gas to be fed.

The formation of a semiconductor layer using the plasma CVD film-forming apparatus shown in FIG. 13 is conducted, for example, in the following manner.

The substrate 902 (having the back reflecting layer and the transparent and electrically conductive layer formed in this order thereon) is fixed onto the surface of the substrate holder 903 and provided with the heater (not shown). The inside of the reaction chamber 901 is evacuated to a predetermined pressure of less than $1 \times 10^{-4}$ Torr by means of the vacuum pump comprising the oil diffusion pump (not shown). When the inner pressure of the reaction chamber 901 became constant at said pressure value, gas such as $H_2$ gas or He gas is introduced into the reaction chamber 901 through the gas feed pipe 915, and the substrate is heated to and maintained at a predetermined temperature by means of the heater (not shown) provided at the substrate holder 903. Predetermined film-forming raw material gas is introduced into the reaction chamber 901 through the gas feed pipe 915, and the microwave power source (not shown) is switched on to supply a microwave power into the reaction chamber 901 through the waveguide 905, the microwave introduction portion 906 and the microwave introduction window 907, whereby causing plasma 910, where the inner pressure of the reaction chamber 901 is adjusted to a predetermined value by regulating the conductance valve 904, and the RF power source 909 is switched on to supply an RF power through the RF power introduction portion, where it is desired for the reflected power to be minimized by regulating the matching circuit (not shown). Successively, the shutter 911 is opened to cause the formation of a film having a predetermined thickness as a given first semiconductor layer on the surface of the transparent and electrically conductive layer of the substrate 902. After the film formation, the shutter 911 is closed, and the introduction of the RF power, the microwave power and the film-forming raw material gas is suspended, and preparation is made for next film formation. Then, the above film-forming procedures were repeated, except for changing the film-forming conditions to those suitable for the next film formation, whereby a given second semiconductor layer is formed on the previously formed first semiconductor layer. In this way, a multi-layered semiconductor layer can be formed on the surface of the transparent and electrically conductive layer of the substrate 902.

The oscillation frequency of the microwave power used in the above, is in the range of 0.1 to 10 GHz. In the case of using a microwave power with an oscillation frequency in the range of 0.1 to 0.5 GHz, it is possible to use a coaxial cable instead of the waveguide 905 and to use a power introduction electrode having a form similar to the RF power introduction portion 908 instead of the microwave introduction window 907. In this case, it is possible to use DC power instead of the RF power.

In FIG. 13, the direction for the microwave power to be introduced into the reaction chamber is parallel to the substrate. But this microwave power-introducing direction can be changed such that the microwave power is introduced from the direction of the normal line of the substrate.

The oscillation frequency of the RF power used in the above, is in the range of 0.3 to 30 MHz, but on an industrial scale, 13.56 MHz is usually used.

The substrate temperature upon the formation of a semiconductor layer comprising an amorphous silicon material (including a microcrystalline silicon material) as the semiconductor layer 105 by plasma CVD, is in the range of 100 to 500° C. When a semiconductor layer comprising a polycrystalline silicon material as the semiconductor layer 105 is formed by plasma CVD, it is in the range of 400 to 600° C.

The inner pressure (the gas pressure) upon the film formation, is in the range of 0.1 to 500 mTorr in the case of microwave plasma CVD. In the case of RF plasma CVD, it is in the range of 0.1 to 5 Torr.

The density of the electric power supplied upon the film formation, when the film formation is conducted by microwave plasma CVD, and the density of the microwave power supplied is in the range of 0.005 to 1 W/cm$^3$, where the density of the RF power supplied together is in the range 0.01 to 1 W/cm$^3$. In this case, it is desired that the density of the RF power supplied be greater than the density of the microwave power. When the film formation is conducted by RF plasma CVD, the density of the RF power supplied is in the range 1 to 100 W/cm$^3$.

The deposition rate (the film-forming speed) of a film as the semiconductor layer 105 which is formed under such film-forming conditions as above described, in the case of microwave plasma CVD, is desired to be controlled to be in the range of 20 to 200 Å/sec by properly adjusting the microwave power supplied or the flow rate of the film-forming raw material gas introduced. In the case of RF plasma CVD, it is desired for the deposition rate to be in the range of 0.2 to 20 Å/sec by properly adjusting the RF power supplied or the flow rate of the film-forming raw material gas introduced.

The film-forming raw material gas for the formation of a given film as the semiconductor layer 105 can include $SiH_4$, $SiF_4$, $Si_2H_6$, $SiH_2Cl_2$, $GeH_4$, $GeF_4$, $SnH_4$, $CH_4$, $C_2H_2$, $CF_4$, $O_2$, $NO_2$, $NH_3$, $NO$, and the like. These raw material gases may be diluted with $H_2$ gas or inert gas such as Ar gas or He gas if necessary.

For the foregoing n-type dopant such as P, As, or Sb used in the formation of the n-type semiconductor layer, an appropriate raw material gas capable to impart such a n-type dopant element is used. As such raw material gas, there can be used $PH_3$, $PF_5$, $P_2O_5$, $AsH_3$, $AsF_3$, $AsCl_3$, $SbF_3$, and $SbF_5$, which are in the gaseous state at room temperature or can be easily gasified. Similarly, for the foregoing p-type dopant such as B or Al used in the formation of thep-type semiconductor layer, an appropriate raw material gas capable imparting such p-type dopant element is used. As such raw material gas, there can be $B_2H_6$, $BF_3$, $AlCl_3$, and $Al(CH_3)_3$, which are in the gaseous state at room temperature or can be easily gasified. Any of these raw material gases may be used by diluting $H_2$ gas or an inert gas such as Ar gas or He gas. The $H_2$ gas in this case may be heavy hydrogen gas.

In the case of forming a given film comprising an amorphous silicon material as the semiconductor layer 105 by means of FR plasma CVD, it is desired for the film-forming raw material gas used for the formation thereof to be diluted to about 1 to about 100 times with $H_2$ gas or an inert gas such as Ar gas or He gas. Similarly, in the case of forming a given film comprising a microcrystalline silicon material as the semiconductor layer 105, it is desired for the film-forming raw material gas used for the formation thereof to be diluted to about 10 to about 1000 times with $H_2$ gas or an inert gas such as Ar gas or He gas.

Upper Transparent Electrode

The upper transparent electrode 106 (or the transparent electrode layer) is used for efficiently guiding incident light into the semiconductor layer and for efficiently guiding photoelectric current to the collecting electrode 107 without loss. In this connection, the upper transparent electrode 106 comprises a transparent and electrically conductive layer formed such that it is difficult to the layer to absorb incident light, that the layer has a controlled thickness to effectively prevent incident light from being reflected, and that the layer has a sufficiently low resistivity. The transparent and electrically conductive layer which satisfies these conditions and which is suitable as the upper transparent electrode is comprised of a material selected from the group consisting of $SnO_2$, $In_2O_3$, ITO ($SnO_2In_2O_3$), and composites of these oxides. The thickness of the transparent and electrically conductive layer as the upper transparent electrode, for instance, in the case where the transparent and electrically conductive layer is constituted by ITO, it is desired to be in the range of about 600 to about 800 Å. In this case, visible light, ultraviolet ray, and infrared ray are effectively guided into the semiconductor layer by the upper transparent electrode.

It is possible for a transparent and electrically conductive layer such as the upper transparent electrode to have a layer comprising $MgF_2$ or $TiO_2$ formed thereon. In this case, the light reflection preventive behavior of the transparent and electrically conductive layer as the upper transparent electrode is further improved.

The formation of the upper transparent electrode on the semiconductor layer may be conducted by means of vacuum deposition or sputtering. For instance, when film formation by vacuum deposition or sputtering is conducted at a substrate temperature of about 100 to about 250° C., there can be formed a transparent and electrically conductive film having an excellent transparency and a desirably low resistivity which is suitable as the upper transparent electrode. From the industrial viewpoint, sputtering is more preferable since the transparent and electrically conductive film as the upper transparent electrode can be formed to have a large area at a relatively high deposition rate. From the viewpoint of production cost, the upper transparent electrode is preferably formed by means of reactive sputtering, where film formation is conducted by positioning a target comprising In, Sn, or InSn (Sn content is, for instance, 5 wt. %) in a deposition chamber and sputtering said target while introducing Ar gas or oxygen gas into the deposition chamber.

The upper transparent electrode 106 thus formed has a resistivity of about $10^{-4}$ Ω.cm. This enables to decrease the series resistance of the photovoltaic element and improve the photoelectric conversion efficiency.

Collecting Electrode

Figure 5:
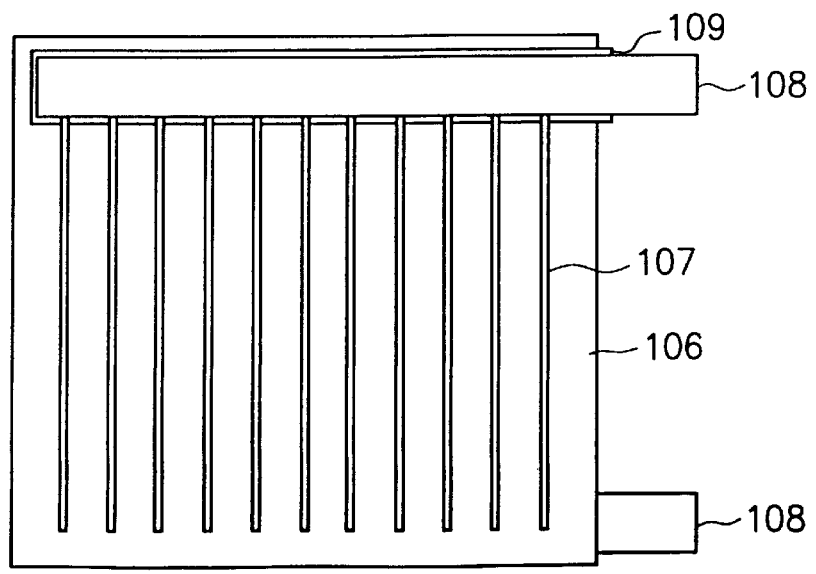
FIG. 5 is a schematic view illustrating the constitution of an example of a light incident side portion of a photovoltaic element (a solar cell) according to the present invention.

The collecting electrode 107 to have an appropriate configuration which causes a slight photo current loss and efficiently guides incident light into the semiconductor layer. For instance, the width and length thereof must be optimized as described in page 112 of Solar Cell Handbook (edited by the Electric Society, published by Corona Company). The collecting electrode is preferably designed to have a comb-like shape as shown in FIG. 5 which is a schematic view from the light incident direction.

The collecting electrode 107 is constituted by a metallic material having a high conductivity such as Au, Ag, Cu, or Al. The collecting electrode may comprise a single-layered body formed of any of these metals or a multi-layered body comprising a layer formed of a given metal selected from these metals and a layer formed of another metal that is different from the metalic material.

As well as in the case of the back reflecting layer, in the case of using a metal, i.e., Au, Ag, or Cu, which is liable to cause migration, it is necessary to prevent the migration from occurring. For this purpose, the collecting electrode is preferably to be formed in a manner wherein a metal wire made of any of these metals as the collecting electrode is coated by a carbon paste containing urethane resin a binder dissolved in cyclohexanone, the metal wire thus coated is laid on the surface of the upper transparent electrode 106, followed by drying, and where the cyclohexanone contained in the carbon coat of the metal wire is vaporized to make the carbon coat desirably bonded to the metal wire through the binder resin while the carbon coat is being desirably bonded to the surface of the upper transparent electrode. The collecting electrode thus formed has an extremely low contact resistance. Alternatively, the collecting electrode may be formed by a method wherein the above carbon paste is screen-printed in a comb pattern on the surface of the upper transparent electrode, a metallic material comprising one of the above mentioned metals is screen-printed on the comb pattern, followed by drying.

In the case of using Al, the collecting electrode may be formed by a method wherein a patterning mask having a comb pattern is laid on the surface of the upper transparent electrode, and a single-layered body comprising Al only or a multi-layered body comprising Al and other metal, for instance, a combination of Cr/Al/Cr is formed in a comb pattern by means of vacuum deposition or sputtering. In order to improve the chemical stability, it is possible to add Ti, Mn, Si, or Mo in an amount of 0.1 to 10 wt. %.

In any case, for a portion of the collecting electrode where the current density is increased, as shown in FIG. 5, it is possible to affix a bus bar (108) comprising a copper foil or the like thereto. In this case, the bus bar (108) maybe fixed by a double-coated tape (109). In the case where the substrate comprises an electrically conductive member, a bus bar (108) comprising a copper foil or the like may be affixed to the rear face of the substrate.

Figure 7:
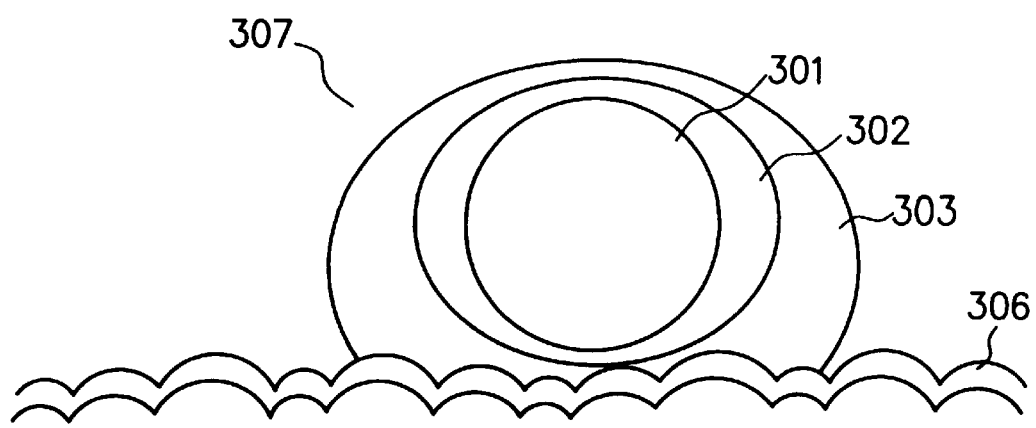
FIG. 7 is a schematic cross-sectional view illustrating the configuration of an example of a collecting electrode used in a photovoltaic element (a solar cell) according to the present invention.

FIG. 7 is a schematic cross-sectional view illustrating the configuration of a preferable example of a collecting electrode 307 used in a photovoltaic element according to the present invention.

The configuration of the collecting electrode 307 shown in FIG. 7 comprises a core comprising a thin copper wire enclosed by a clad layer 302 comprising Ag, and the exterior surface of the Ag clad layer 302 is covered by a carbon layer 303 containing acrylic resin as a binder. In this collecting electrode, the Ag clad layer 302 functions to reduce the contact resistance with the copper wire 301, and the carbon layer 303 functions to maintain the adhesion with the upper transparent electrode 306 and to reduce the contact resistance with the Ag clad layer 302. The carbon layer also functions to prevent the Ag contained in the Ag clad layer from being diffused into the semiconductor layer.

Photovoltaic Element Module

Figure 8:
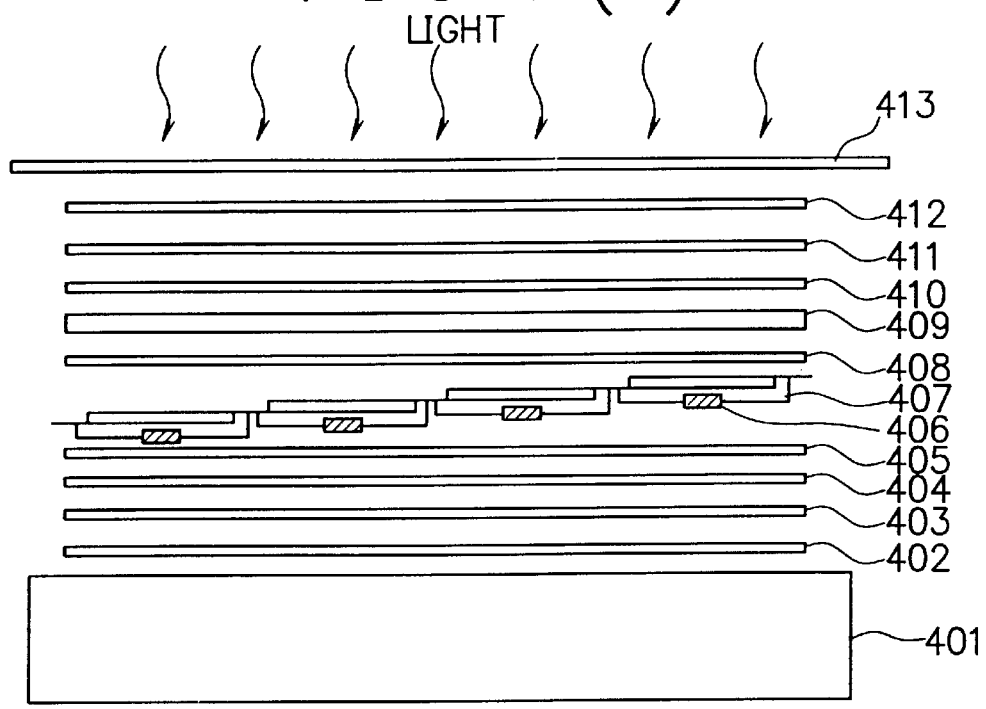
FIG. 8($a$) is a schematic cross-sectional view illustrating the configuration of an example of a photovoltaic element module (a solar cell module) according to the present invention.
Figure 8:
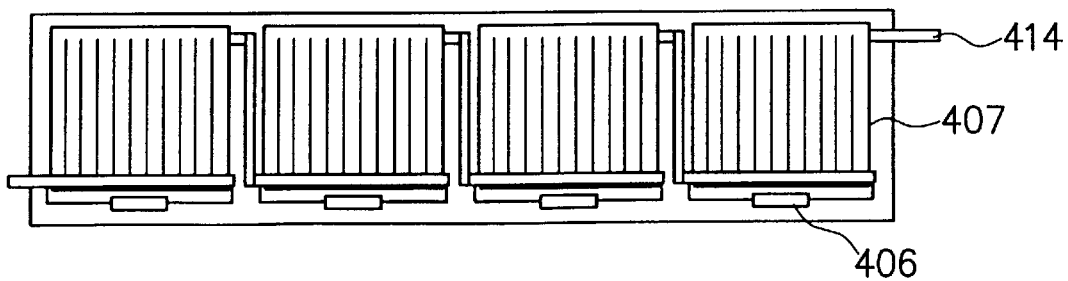

FIG. 8(*a*) is a schematic cross-sectional view illustrating the configuration of an example of a module in which an integrated body comprising a plurality of photovoltaic elements according to the present invention electrically connected in series connection is sealed by way of resin sealing.

FIG. 8(*b*) is a schematic view illustrating the configuration of a light receiving face of the integrated body in the module shown in FIG. 8(*a*).

Particularly, the module shown in FIGS. 8(*a*) and 8(*b*) is a module produced by providing a stacked body obtained by (a) laminating an EVA (ethylene-vinylacetate copolymer) sheet 402; a nylon resin sheet 403; an EVA sheet 404; and a nonwoven glass member 405 in this order on a support member 401, and (b) laminating, on said nonwoven glass member 405, an integrated body which comprises a plurality of photovoltaic elements 407 configured as above described being electrically connected with each other in series connection and which has a plurality of bypass diodes 406 respectively provided at each photovoltaic element in electrically parallel connection to other photovoltaic element as shown in FIG. 8(*a*); a nonwoven glass member 408; an EVA sheet 409; a nonwoven glass member 410; an EVA sheet 411; a nonwoven glass member 412; and a fluororesin film 413 in this order, and subjecting the stacked body to vacuum thermo compression bonding treatment.

The EVA's use as the filler may be replaced by a transparent organic resin such as EEA or acrylic urethane resin. The nylon resin is used for the insulating purpose. The nylon resin may be replaced by PET or the like.

The module configured as described above effectively prevents moisture invasion and excels in weatherability.

In the following, the present invention will be described in more detail with reference to examples. It should be understood that these examples are only for illustrative purposes and not intended to restrict the scope of the present invention to these examples.

EXAMPLE 1

There was prepared a solar cell (a photovoltaic element) of the configuration shown in FIG. 2 and whose semiconductor layer having a pin junction.

Particularly, under conditions shown in Table 1, there was prepared a solar cell (a photovoltaic element) comprising a stacked structure which comprises a substrate 101 (a SUS 430 stainless steel plate (trade name) having a size of 10 cm×10 cm and a thickness of 0.2 mm)/a back reflecting layer 102 composed of Al/a transparent and electrically conductive layer 103 composed of ZnO (comprising a first transparent and electrically conductive layer 103*a* and a second transparent and electrically conductive layer 103*b*)/a semiconductor layer 105 comprising an n-type semiconductor layer composed of a-Si:H:P, an i-type semiconductor layer composed of a-SiGe:H and a p-type semiconductor layer composed of $\mu$c-Si:H:B/an upper transparent electrode 106 composed of ITO/a collecting electrode 107 (comprising a Cu wire (as a core) covered by an Ag clad layer and a carbon (C) clad layer).

Here, the back reflecting layer 102, the first transparent and electrically conductive layer 103*a*, and the second transparent and electrically conductive layer 103*b* were formed in accordance with the foregoing film-forming procedures by way of sputtering using the apparatus shown in FIG. 12. The semiconductor layer 105 was formed in accordance with the film-forming procedures by way of plasma CVD using the apparatus shown in FIG. 13, where the i-type semiconductor layer was formed by way of microwave plasma CVD, and the n-type semiconductor layer and the p-type semiconductor layer were formed by way of RF plasma CVD. The upper transparent electrode 106 was formed by way of sputtering.

The collecting electrode 107 was provided on the upper transparent electrode 106 in the following manner. That is, at an edge portion of the upper transparent electrode 106 under which the semiconductor layer 105, the transparent and electrically conductive layer 103 and the back reflecting layer 102 are stacked on the substrate 101, as shown in FIG. 5, a commercially available insulating double-coated tape 109 was affixed, a copper foil was put thereon, a component (as a collecting electrode 107) comprising a core comprising a Cu-wire/an Ag-clad layer/a carbon clad layer was wired, a bus bar 108 was arranged, and then subjecting to the thermocompression bonding treatment.

The above procedures were repeated to obtain a plurality of solar cells (photovoltaic elements).

For one of the resultant solar cells, its cross section was observed by means of a scanning electron microscope (SEM). As a result, the cross section of the transparent and electrically conductive layer was found to have a structural pattern shown in FIG. 2.

COMPARATIVE EXAMPLE 1

Figure 6:
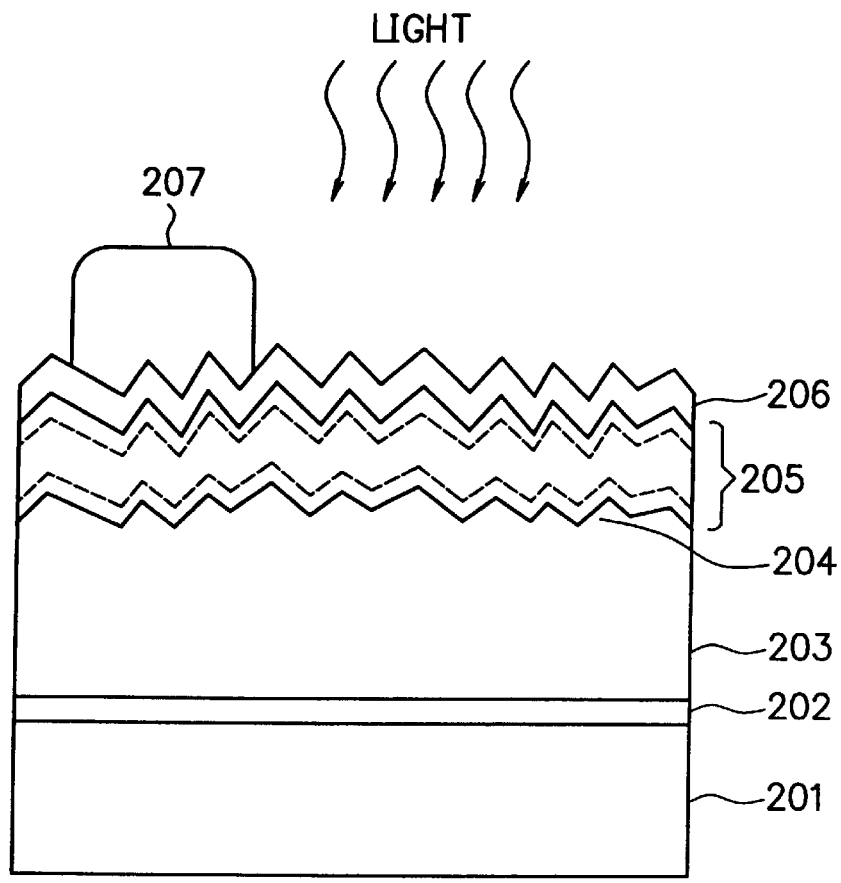
FIG. 6 is a schematic cross-sectional view illustrating the configuration of an example of a conventional photovoltaic element (a conventional solar cell).

In this comparative example, there was prepared a solar cell (a photovoltaic element) having the configuration shown in FIG. 6 in accordance with the procedures for the preparation of the solar cell in Example 1, except that in the formation of the transparent and electrically conductive layer in Example 1, a single-layered transparent and electrically conductive layer composed of ZnO was formed by means of sputtering under conditions shown in Table 2.

Herein, in FIG. 6, reference numeral 201 indicates a substrate, reference numeral 202 a back reflection layer, reference numeral 203 a transparent and electrically conductive layer, reference numeral 204 a light incident side surface of the transparent and electrically conductive layer 203, reference numeral 205 a semiconductor layer, reference numeral 206 an upper transparent electrode, and reference numeral 207 a collecting electrode.

The above procedures were repeated to obtain a plurality of solar cells (photovoltaic elements).

For one of the resultant solar cells, its cross section was observed by means of SEM. As a result, the cross section of the transparent and electrically conductive layer was found to have a pattern shown in FIG. 6.

Evaluation

The solar cells obtained in Example 1 (these solar cells will be hereinafter referred to as Ex. 1 sample) and the solar cells obtained in Comparative Example 1 (these solar cells will be hereinafter referred to as Comp. 1 sample), were evaluated with respect to solar cell characteristics as will be described below.

(1). For each of Ex. 1 sample and Comp. 1 sample, evaluation was conducted with respect to initial characteristics (photoconductive characteristic, leakage current, and open-circuit voltage at low illuminance). Particularly, using a conventional solar cell simulator (spectrum: AM 1.5, intensity: 100 mW/cm$^2$, surface temperature: 25° C.), (i) photoelectric conversion efficiency, (ii) open-circuit voltage, and (iii) short-circuit photo current were measured. As a result, it was found that Ex. 1 sample has surpassed Comp. 1 sample by 1.15 times, 1.04 times, and 1.06 times with respect to the three evaluation items (i), (ii) and (iii).

(2). For each of the Ex. 1 sample and the Comp. 1 sample having been subjected to the evaluation in (1), its open-circuit voltage when exposed to light irradiation from a fluorescent lamp (of low illuminance) of about 500 lux in illuminance was measured. As a result, the Ex. 1 sample was found to surpass the Comp. 1 sample by 1.5 times with respect to the open-circuit voltage at low illuminance.

(3). For each of the Ex. 1 sample and the Comp. 1 sample having been subjected to the evaluation in the above (2), reverse bias was applied in the dark, and a leakage current was measured. As a result, the leakage current of the EX. 1 sample was found to be about 1/10 of that of the Comp. 1 sample. Thus, it is understood that the former is excellent in terms of the leakage current.

(4). For each of the Ex. 1 sample and the Comp. 1 sample having been subjected to the evaluation in (3), as an accelerated test, and HHRB test (endurance test against high temperature, high humidity and reverse bias application) was conducted. Particularly, the two samples were positioned in an environmental test box at 85° C./85% RH and allowed to stand for an hour, and maintained maintained for 150 hours while applying a reverse bias of 0.85 V to the two samples. Thereafter, the inside atmosphere of the environmental test box was adjusted to have 25° C. for the environmental temperature and 50% environmental humidity, and allowed to stand for an hour. After this, the two samples were taken out from the environmental test box. For each of the two samples thus treated, evaluation was conducted with respect to (i) photoelectric conversion efficiency, (ii) open-circuit voltage, and (iii) short-circuit photo current in the same manner as in the above (1). As a result, it was found that the Ex. 1 sample has surpassed the Comp. 1 sample by 1.07 times, 1.03 times, and 1.01 times with respect to the three evaluation items (i), (ii) and (iii).

In addition, for each of these two samples, its open-circuit voltage at low illuminance and its leakage current were measured. As a result, it was found that the open-circuit voltage of the Ex. 1 sample was 1.4 times that of the comp. 1 sample, and the leakage current of the Ex. 1 sample was about 1/8 of that of the comp. 1 sample.

(5). Using one of the remaining Ex. 1 samples and one of the remaining Comp. 1 samples, a light irradiation test was conducted. Particularly, prior to subjecting each sample to the test, its photoelectric conversion efficiency, open-circuit voltage, short-circuit photo current, open-circuit voltage at low illuminance, and leakage current were measured. Then, the sample was exposed in a conventional solar cell simulator (spectrum: AM 1.5, intensity: 100 mW/cm$^2$, surface temperature: 25° C.) for 500 hours. After this, its photoelectric conversion efficiency, open-circuit voltage, short-circuit photo current, open-circuit voltage at low illuminance, and leakage current were measured.

As a result, each of the two samples was found to have a change in the open-circuit voltage, open-circuit voltage at low illuminance, and leakage current.

Particularly, the rate of change between the open-circuit voltage before the test and that after the test, was 0.95 for the Ex. 1 sample, and 0.93 for the comp. sample 1.

The rate of change between the open-circuit voltage at low illuminance before the test and that after the test, it was 0.94 for the Ex. 1 sample, and was 0.89 for the comp. sample 1.

The rate of change between the leakage current before the test and that after the test, was 1.3 for the Ex. 1 sample and was 2.5 for the comp. sample 1.

(6). Using one of the remaining Ex. 1 samples and one of the remaining Comp. 1 samples, a hailing test (described in JIS C8917 relating to solar cell) was conducted. Particularly, prior to subjecting each sample to the test, its photoelectric conversion efficiency, open-circuit voltage, short-circuit photo current, open-circuit voltage at low illuminance, and leakage current were measured.

Then, each sample was subjected to the hailing test in the following manner. That is, a plurality of balls of ice, each having a diameter of 25 mm, were uniformly over the surface of the sample at a terminal velocity of 23 m/sec ten times.

For each of the two samples thus treated, its exterior appearance was observed. As a result, each sample was found to be substantially free of a distinguishable defect in the exterior appearance.

Then, for each of the two samples thus treated, its photoelectric conversion efficiency, open-circuit voltage, short-circuit photo current, open-circuit voltage at low illuminance, and leakage current were measured.

As a result, each of the two samples was found to have had a change in the open-circuit voltage, open-circuit voltage at low illuminance, and leakage current.

Particularly, the rate of change between the open-circuit voltage before the test and that after the test, was 0.98 for the Ex. 1 sample and it was 0.94 for the comp. sample 1.

The rate of change between the open-circuit voltage at low illuminance before the test and that after the test, it was 0.97 for the Ex. 1 sample and it was 0.92 for the comp. sample 1.

The rate of change between the leakage current before the test and that after the test, was 1.1 for the Ex. 1 sample and it was 2.1 for the comp. sample 1.

Based on the above described results, it is understood that the photovoltaic element obtained in Example 1 is apparently surperior to the comparative photovoltaic element obtained in Comparative Example 1.

Figure 10:
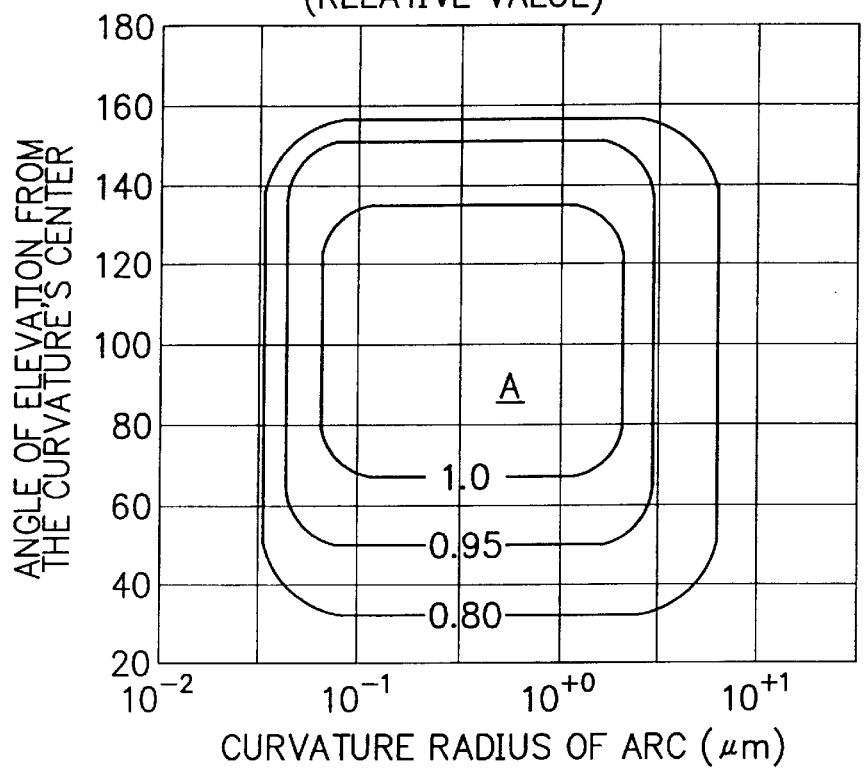
FIG. 10 is a graph for a plurality of photovoltaic elements (solar cells) each having one of a plurality of transparent and electrically conductive layers according to the present invention, each transparent and electrically conductive layer having a light incident side surface with a cross section having a plurality of arcs arranged while being contacted with eachother, said arcs having a given radius of curvature and a given angle of elevation from the center of the curvature, said graph showing the interrelations among said transparent and electrically conductive layers each having said given radius of curvature and said given angle of elevation from the center of the curvature and the photoelectric conversion efficiencies of the photovoltaic elements.

(7). Separately, the procedures of Example 1 were repeated, except that the film-forming temperature (the substrate temperature) in the formation of the transparent and electrically conductive layer was varied, to obtain a plurality of solar cells (photovoltaic elements). For each of the resultant solar cells, its photoelectric conversion efficiency was measured. Then, for the transparent and electrically conductive layer of each solar cell, the cross-section thereof was examined by means of a scanning electron microscope (SEM). The cross section was found to have a plurality of arcs arranged in contacted with each other, their radius of curvature (r) and the angle of elevation (α) from the center of the curvature were measured. The interrelations between the measured values and the photoelectric conversion efficiencies are shown in FIG. 10. Based on the results, it was found that when the transparent and electrically conductive layer has a cross section containing regions of 0.03 to 6 μm with respect to the radius of curvature (r) and of 300 to 155° with respect to the angle of elevation (α) at a proportion of more than 80% as compared to the entire region of the cross section, the solar cell has a very good photoelectric conversion efficiency. In addition, it was found that when the cross section has a plurality of regions each based on a bisection of the arc which passes the center of the curvature and which is substantially perpendicular to the surface of the substrate at a proportion of more than 80% as compared to the entire region of the cross section, the solar cell has an excellent photoelectric conversion efficiency. The term substantially perpendicular herein means that the angle of the bisection to the surface of the substrate is in the range of 85° to 90°.

EXAMPLE 2

Under conditions shown in Table 3 and in accordance with the procedures in Example 1, there was prepared a solar cell (a photovoltaic element) of the configuration shown in FIG. 2, provided that the semiconductor layer 105 was of a triple cell type having three pin junctions as shown in FIG. 9.

Particularly, there was prepared a solar cell (a photovoltaic element) comprising a substrate 101 (a SUS 430 stainless steel plate (trade name) having a size of 10 cm×10 cm and a thickness of 0.2 mm)/a back reflecting layer 102 composed of Al/a first transparent and electrically conductive layer 103a composed of ZnO/a second transparent and electrically conductive layer 103b composed of Zno/a semiconductor layer 105 (comprising a first n-type semiconductor layer composed of a-Si:H:P/a fist i-type semiconductor layer composed of a-SiGe:H/a first p-type semiconductor layer composed of μc-Si:H:B/a second n-type semiconductor layer composed of a-Si:H:P/a second i-type semiconductor layer composed of a-SiGe:H/a second p-type semiconductor layer composed of μc-Si:H:B/a third n-type semiconductor layer composed of a-Si:H:P/a third i-type semiconductor layer composed of a-Si:H/a third p-type semiconductor layer composed of μc-Si:H:B)/an upper transparent electrode 106 composed of ITO/a collecting electrode 107 (comprising a Cu wire (as a core) covered by an Ag clad layer and a carbon (C) clad layer).

The above procedures were repeated to obtain a plurality of solar cells (photovoltaic elements).

For one of the resultant solar cells, its cross-section was observed by means of SEM. As a result, the light incident side surface region of the transparent and electrically conductive layer (comprising the first and second transparent and electrically conductive layers) was found to have a structural pattern shown in FIG. 2. Then, the c axis orientation of the first transparent and electrically conductive layer was examined. As a result, the first transparent and electrically conductive layer was found to have regions whose c axis were parallel to the surface of the substrate at a proportion of about 85%. In addition, the c axis orientation of the second transparent and electrically conductive layer was examined. As a result, the second transparent and electrically conductive layer was found to have regions whose c axis were substantially perpendicular to the surface of the substrate at a proportion of about 90%.

COMPARATIVE EXAMPLE 2

The procedures of Example 2 were repeated, except that the first and second transparent and electrically conductive layers were not formed but a conventional transparent and electrically conductive layer was formed, to obtain a plurality of solar cells (photovoltaic elements).

For one of the resultant solar cells, the cross section was observed by means of SEM. As a result, the cross section of the transparent and electrically conductive layer was found to have a pattern shown in FIG. 6.

Evaluation

An evaluation of the solar cells obtained in Example 2 and Comparative Example 2, was conducted in the same manner as in Example 1 and Comparative Example 1. As a result, it was found that the solar cells obtained in Example 2 are superior to those obtained in Comparative Example 2 with respect to every evaluated item.

EXAMPLE 3

In this example, there was prepared a solar cell module having such configuration as shown in FIG. 8. As the solar cell (photovoltaic element), there was used a solar cell (photovoltaic element) having the configuration shown in FIG. 4. The semiconductor layer 105 was a triple cell type having three pin junctions as shown in FIG. 9 as well as in Example 2.

As the substrate, there was used a long sheet member. Using a roll-to-roll film-forming system, a back reflecting layer, an intermediate layer, a first transparent and electrically conductive layer, and a second transparent and electrically conductive layer were sequentially formed on the long sheet member. The formation of a semiconductor layer and an upper transparent electrode was also conducted using a roll-to-roll film-forming system. In the following, a detailed description will be made about the preparation of a solar cell module in this example.

Figure 14:
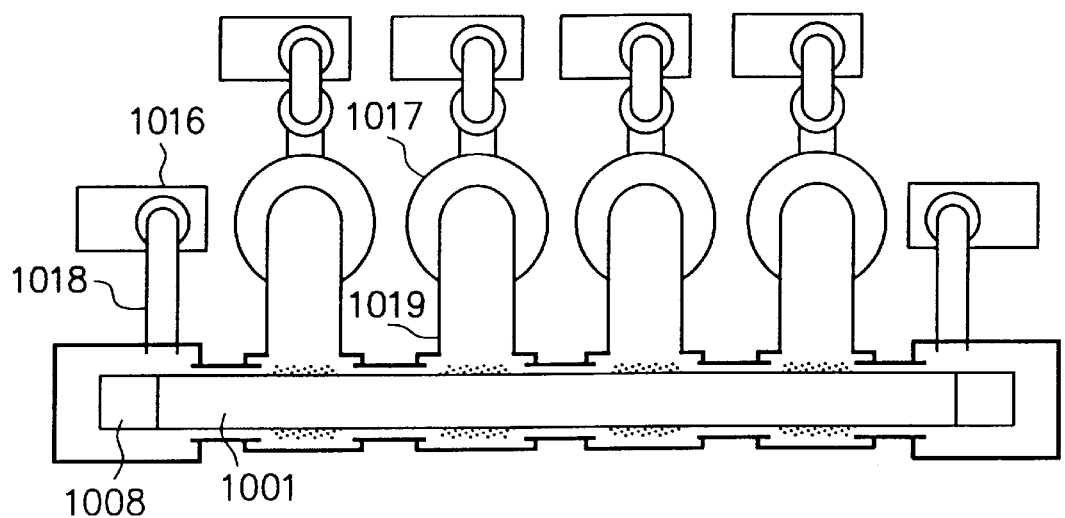
FIGS. 14($a$) and 14($b$) are schematic views illustrating the constitution of an example of a roll-to-roll multi-chambered film-forming apparatus which is used for the formation of a back reflecting layer and a transparent and electrically conductive layer in the production of a photovoltaic element (a solar cell) of the present invention, where FIG. 14($a$) is a schematic view of the film-forming apparatus when viewed from above, and FIG. 14($b$) is a schematic cross-sectional view of the film-forming apparatus when laterally viewed.
Figure 14:
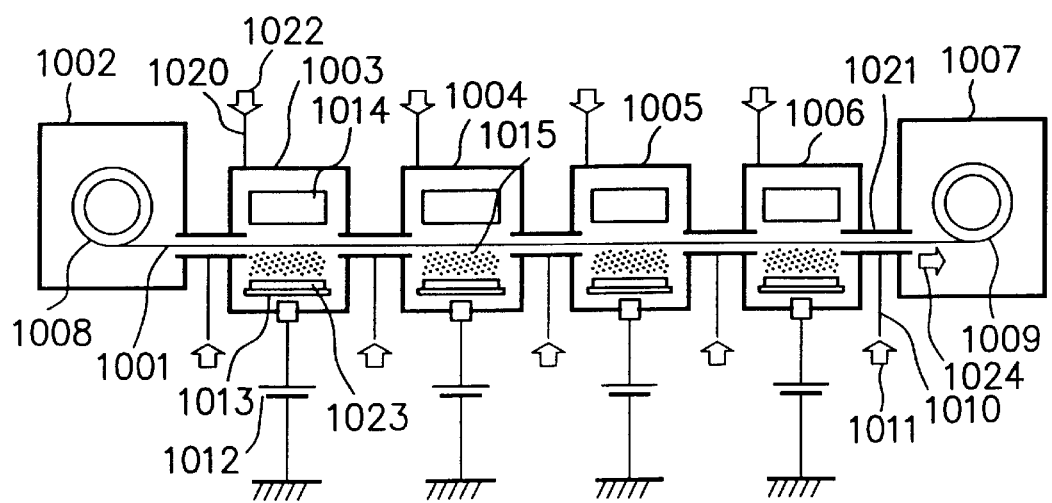

FIGS. 14(*a*) and 14(*b*) are schematic views illustrating the constitution of an example of a roll-to-roll multi-chambered film-forming apparatus which can continuously form a plurality of thin films on a flexible long substrate under vacuum condition, where FIG. 14(*a*) is a schematic view of the film-forming apparatus when viewed from above, and FIG. 14(*b*) is a schematic cross-sectional view of the film-forming apparatus when laterally viewed.

In FIGS. 14(*a*) and 14(*b*), reference numeral 1001 indicates a flexible substrate web (a flexible long substrate) made of stainless steel or the like. Reference numeral 1002 indicates a substrate feed chamber capable of being vacuumed in which a pay-out roll 1008 having the substrate web 1001 wound thereon is provided. Reference numeral 1007 indicates an unload chamber capable of being vacuumed in which a take-up roll 1009 to take up the substrate web 1001 while winding it thereon is provided. Each of the feed chamber 1002 and the unload chamber 1007 is connected to a vacuum pump 1016 (comprising, for instance, a rotary pump) through piping 1018. Vacuum deposition chambers 1003, 1004, 1005 and 1006 capable of forming a desired film by way of DC magnetron sputtering are arranged between the feed chamber 1002 and the unload chamber 1007, where these chambers 1002–1007 are communicated with each other through gas gates 1021 as shown in FIG. 14(*b*).

A gas supply pipe 1010 is connected to each gas gate 1021 so as to flow scavenging gas 1011 such as Ar gas into the gas gate 1021 in order to prevent from a given gas used in one chamber and a given gas used in the other chamber from diffusing. This enables the formation of a desired junction between two films involved. In the case where adjacent deposition chambers are used for forming the same film, it is not always necessary to provide the gas gate between the deposition chambers.

Each of the deposition chambers 1003–1006 is connected to a diffusion pump 1017 through piping 1019, which is connected to a vacuum pump such as a rotary pump through piping. Each of the deposition chambers 1003–1006 is provided with a heater 1014 for heating the substrate web 1001, a target 1023 for forming a desired film on the substrate web 1001, an electrode 1013 provided with a magnet therein, and a gas feed pipe 1020 for introducing sputtering gas 1022. Each electrode 1013 is electrically connected to a DC power source 1012.

Film formation using the film-forming apparatus shown in FIGS. 14(*a*) and 14(*b*) is conducted, for example, in the following manner.

A pay-out roll 1008 having a cleaned substrate web 1001 (made of stainless steel or the like) wound thereon is placed in the feed chamber 1002. The substrate web 1001 is paid out from the pay-out roll 1008, passed through the respective gas gates and the deposition chambers 1003–1006, and fixed to the take-up roll 1009 in the unload chamber 1007. The substrate web 1001 is adjusted not to have any loose parts. By actuating the respective vacuum pumps, the respective chambers are evacuated to a vacuum of several mTorr. Through the gas supply pipes 1010, Ar gas is flown into the gas gates, and through each of the gas feed pipes 1020, given film-forming raw material gas is introduced into each of the deposition chambers 1003–1006. Each of the heaters 1014 is actuated, and the substrate web 1001 is moved in the direction expressed by an arrow mark 1024. When the substrate web reaches a constant at a desired temperature, the DC power sources 1012 are switched on to cause plasma generation in the deposition chambers 1003–1006, whereby forming a desired film on the substrate web 1001 in each deposition chamber. When the substrate web 1001 paid out from the pay-out roller comes to closer to its end portion, the transportation thereof is terminated, the heaters and the DC power sources are switched off, and the introduction of the film-forming raw material gases is terminated. Then, the remaining substrate web's portion with no film deposition is entirely wound on the take-up roll 1009 in the unload chamber 1007. When the substrate web wound on the take-up roll reaches room temperature, all the chambers are leaked to atmospheric pressure, and the take-up roll having the substrate web wound thereon is removed from the unload chamber.

In this example, in accordance with the above described film-forming procedures and under conditions shown in Table 4, a back reflecting layer, an intermediate layer, a first transparent and electrically conductive layer and a second transparent and electrically conductive layer were continuously formed in this order on a substrate web made of stainless steel and having a thickness of 0.15 mm as the foregoing substrate web 1001.

Reflectivity of the four-layered body thus formed on the substrate web, was examined. As a result, there was obtained a good reflection spectrum. In addition, for the second transparent and electrically conductive layer, the cross section of its light incident side surface region was examined by means of SEM. As a result, the cross section was found to have a structural pattern comprising a plurality of arcs arranged while in contact with each other as shown in FIG. 4. Furthermore, for the transparent and electrically conductive layer (comprising the first and second transparent and electrically conductive layers), the number of pinholes present therein was carefully examined. As a result, the number of pinholes was found to be small.

Figure 15:
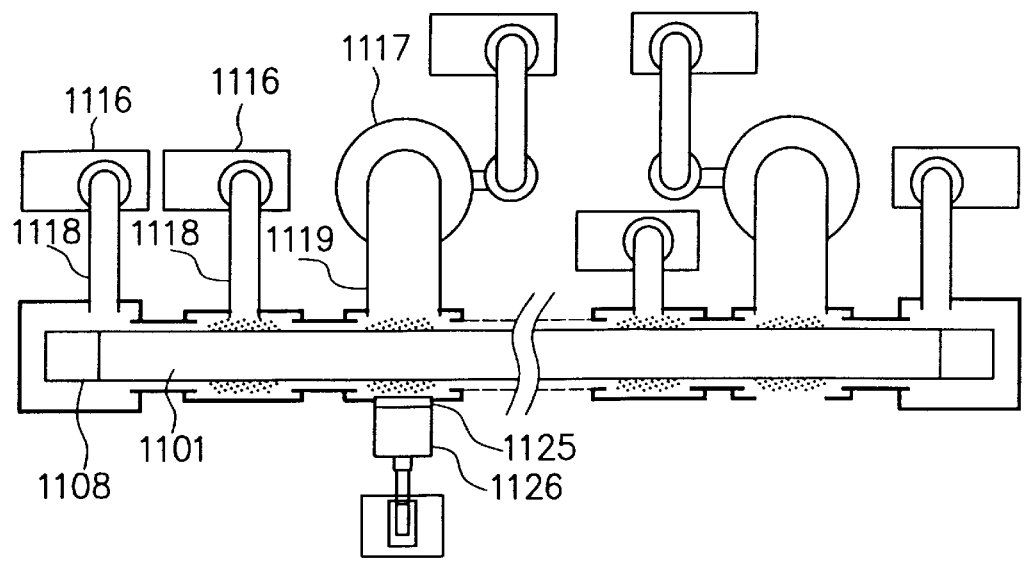
FIGS. 15($a$), 15($b$) and 15($c$) are schematic views illustrating the constitution of an example of a roll-to-roll multi-chambered film-forming apparatus which is used for the formation of a semiconductor layer in the production of a photovoltaic element (a solar cell) of the present invention, where FIG. 15($a$) is a schematic view of the film-forming apparatus when viewed from above, FIG. 15($b$) is a schematic cross-sectional view of the film-forming apparatus when laterally viewed, and FIG. 15($c$) is a schematic view of vacuum chambers provided in the film-forming apparatus.
Figure 15:
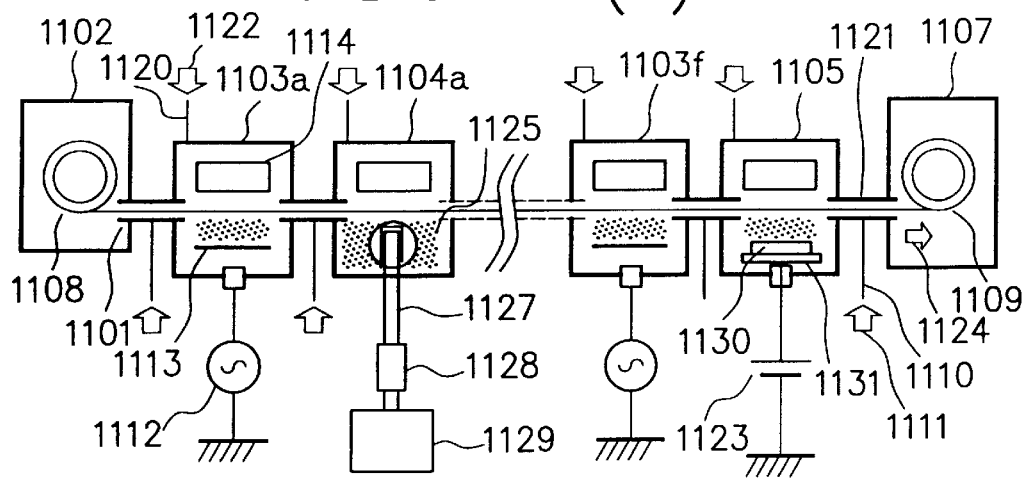
Figure 15:
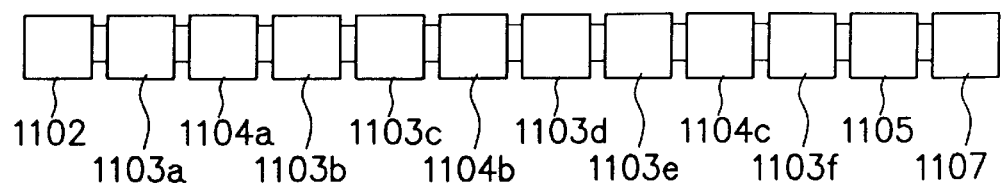

On the foregoing second transparent and electrically conductive layer, there was formed a semiconductor layer using the roll-to-roll multi-chambered film-forming apparatus shown in FIGS. 15(*a*), 15(*b*) and 15(*c*).

The film-forming apparatus shown in FIGS. 15(*a*) to 15(*c*) enables to continuously form nine semiconductor layers on a long substrate (a substrate web). In FIGS. 15(*a*) and 15(*b*), six vacuum chambers are omitted for simplification purposes. In the figures, reference numeral 1101 indicates the substrate web having the foregoing four layers formed thereon. Reference numeral 1102 indicates a substrate feed chamber capable of being evacuated to a vacuum in which a pay-out roll 1108 having the substrate web 1101 wound thereon is provided. Reference numeral 1107 indicates an unload chamber capable of being evacuated to a vacuum in which a take-up roll 1109 to take up the substrate web 1101 while winding it thereon is provided. Each of the feed chamber 1102 and the unload chamber 1107 is connected to a vacuum pump 1116 (comprising, for instance, a rotary pump) through piping 1118. Vacuum chambers 1103*a*, 1104*a*, 1103*b* (not shown), 1103*c* (not shown), 1104*b* (not shown), 1103*d* (not shown), 1103*e* (not shown), 1104*c* (not shown), 1103*f* and 1105 are arranged between the feed chamber 1102 and the unload chamber 1107, where these chambers 1103*a*–1105 are communicated with each other through gas gates 1121 as shown in FIG. 15(*b*).

A gas supply pipe 1110 is connected to each gas gate 1121 so as to flow scavenging gas 1111 such as Ar gas into the gas gate 1121 in order to prevent from given gases used in different chambers. This enables s formstion of a desired semiconductor junction between two films involved. In the case where given adjacent vacuum chambers are used for forming the same film, it is not always necessary to provide the gas gate between the vacuum chambers.

In each of the vacuum chambers 1103*a*, 1103*b*, 1103*c*, 1103*d*, and 1103*e*, film formation by means of RF plasma CVD can be conducted. Each of these vacuum chambers is connected to a rotary pump 1116 through piping 1118. And to each of these vacuum chambers, a gas feed pipe 1120 for introducing film-forming raw material gas 1122 is connected. Each of the vacuum chambers 1103*a*, 1103*b*, 1103*c*, 1103*d*, and 1103*e* is provided with a heater 1114 for heating the substrate web 1101 and an RF electrode 1113 therein. Each RF electrode is electrically connected to an RF power source 1112.

In each of the vacuum chambers 1104*a*, 1104*b*, and 1104*c*, film formation by means of microwave (MW) plasma CVD can be conducted. Each of these vacuum chambers is connected to a diffusion pump 1117 through piping 1119, which is also connected to a vacuum pump rotary pump. And to each of these vacuum chambers, a gas feed pipe 1120 for introducing film-forming raw material gas 1122 is connected. Each of these vacuum chambers is provided with a heater 114 therein.

Each of the vacuum chambers 1104a, 1104b, and 1104c is provided with a dielectric window 1125 (a microwave introduction window) at the circumferential wall. The dielectric window 1125 is electrically connected to a microwave power source 1129 through a microwave introduction portion 1126, a waveguide 1127 and a matching circuit 1128.

A microwave power from the microwave power source 1129 transmits through the matching circuit 1128, the waveguide 1127 and the microwave introduction portion 1126, and it is finally introduced into the vacuum chamber through the dielectric window 1125.

In the vacuum chamber 1105, the formation of an upper transparent electrode is conducted by means of DC magnetron sputtering. This vacuum chamber is connected to a diffusion pump and a rotary pump (not shown). A gas feed pipe 1120 is connected to this vacuum chamber.

In the vacuum chamber 1105, a target 1130 for forming an upper transparent electrode, an electrode 1131 with a magnet therein, and a heater 1114 are provided. The electrode 1131 is electrically connected to a DC power source 1123.

Film formation using the film-forming apparatus shown in FIGS. 15(a) to 15(c) is conducted, for example, in the following manner.

A pay-out roll 1108 having the foregoing substrate web (having the back reflecting layer, the intermediate layer, the first transparent and electrically conductive layer and the second transparent and electrically conductive layer formed thereon) wound thereon is placed in the feed chamber 1102. The substrate web 1101 is paid out from the pay-out roll 1108, passed through the respective gas gates and the respective vacuum chambers, and fixed to the take-up roll 1109 in the unload chamber 1107. The substrate web 1101 is adjusted not to have any loose parts. By actuating the respective vacuum pumps, the respective vacuum chambers are evacuated a vacuum of several mTorr. Through the gas supply pipes 1110, Ar gas is flown into the gas gates, and through each of the gas feed pipes 1120, given film-forming raw material gas for the formation of a semiconductor layer is introduced into each of the corresponding vacuum chambers for the formation of a semiconductor layer, and given sputtering gas is introduced into the vacuum chamber for the formation of an upper transparent electrode. Each of the heaters 1114 is actuated, and the substrate web 1101 is moved in the direction expressed by an arrow mark 1124 [see, FIG. 15(b)]. When the temperature of the substrate web becomes constant at a desired temperature, the RF power sources, the microwave power sources and the DC power source are switched on to cause plasma generation in the respective vacuum chambers, whereby forming a desired film on the substrate web 1101 in each vacuum chamber. When the substrate web 1101 paid out from the pay-out roller comes closer to its end portion, the transportation thereof is terminated, the heaters and all the power sources are switched off, and the introduction of the film-forming raw material gases is terminated. Then, the remaining substrate web's portion is entirely wound on the take-up roll 1109 in the unload chamber 1107. When the substrate web wound on the take-up roll reaches room temperature, all the chambers are leaked to atmospheric pressure, and the take-up roll having the substrate web wound thereon is removed from the unload chamber.

In accordance with the above described film-forming procedures and under conditions shown in Table 4, on the substrate web (that is, on the second transparent and electrically conductive layer), there were sequentially formed a first n-type semiconductor layer composed of a-Si:H:P; a fist i-type semiconductor layer composed of a-SiGe:H; a first p-type semiconductor layer composed of $\mu$c-Si:H:B; a second n-type semiconductor layer composed of a-Si:H:P; a second i-type semiconductor layer composed of a-SiGe:H; a second p-type semiconductor layer composed of $\mu$c-Si:H:B; a third n-type semiconductor layer composed of a-Si:H:P; a third i-type semiconductor layer composed of a-Si:H; a third p-type semiconductor layer composed of $\mu$c-Si:H:B; and an upper transparent electrode composed of ITO.

The substrate web having the triple cell semiconductor layer and the upper transparent electrode formed thereon was taken out from the film-forming apparatus, and it was cut to obtain a plurality of photovoltaic elements of 30 cm×30 cm in size. At each of these photovoltaic elements, a collecting electrode and a bus bar were provided in the same manner as in Example 1.

Thus, there was obtained a plurality of solar cells. Four of these solar cells were integrated in series as shown FIGS. 8(a) and 8(b), and a bypass diode was provided at each solar cell in electrically parallel connection to other photovoltaic element as shown in FIG. 8(a). The resulting construct will be hereinafter referred to as integrated solar cell body.

Then, on a support member of 3 mm in thick, there were sequentially laminated an EVA (ethylene-vinylacetate copolymer) sheet; a nylon resin sheet; an EVA sheet; a nonwoven glass member; the solar cell integrated body; a nonwoven glass member; an EVA sheet; a nonwoven glass member; an EVA sheet; a nonwoven glass member; and a fluororesin film, to obtain a stacked body. The stacked body was subjected to vacuum thermocompression bonding treatment to obtain a solar cell module.

The resultant solar cell module was evaluated in the same manner as in Examples 1 and Comparative Example 1. As a result, in the evaluation of the initial characteristics, an HHRB test, a hailing test, and a light irradiation test, there was obtained satisfactory results. And the characteristics of the solar cell module were even better than those of the solar cell in Example 1.

In addition, for the solar cell module, a twist test based on Solar Cell JIS C8917 was conducted. Particularly, three corners of the solar cell module were fixed, and a cycle of displacing (twisting) the remaining one corner 3 cm was repeated 50 times. After this test, the solar cell module was evaluated with respect to photoconductive characteristic, leakage current and open-circuit voltage at low illuminance. The results of these evaluation items were compared with those before the test. The rates of change were found to be 0.99, 1.1, and 0.97, which are satisfactory.

Hence, the solar cell module was found to excel in the solar cell characteristics.

EXAMPLE 4

The procedures of Example 1 were repeated, except that the thickness of the transparent and electrically conductive layer was changed to 2 $\mu$m, to obtain a plurality of solar cells.

For one of the resultant solar cells, its cross section was observed by means of SEM. As a result, the light incident side surface region of the transparent and electrically conductive layer was found to have a structural pattern shown in FIG. 2. Then, the c axis orientation of the transparent and electrically conductive layer was examined. As a result, the first transparent and electrically conductive layer was found to have regions whose c axis were substantially perpendicular to the surface of the substrate at a proportion of about 95%.

Using one of the remaining solar cells, a evaluation was conducted in the same manner as in Example 1 and Comparative Example 1. As a result, the solar cell was found to have excellent solar cell characteristics as well as in Example 1.

EXAMPLE 5

The procedures of Example 2 were repeated, except that the thickness of the first transparent and electrically conductive layer was changed to 0.05 μm and the thickness of the second transparent and electrically conductive layer was changed to 1.5 μm, to obtain a plurality of solar cells.

For one of the resultant solar cells, its cross section was observed by means of SEM. As a result, the light incident side surface region of the transparent and electrically conductive layer was found to have a structural pattern shown in FIG. 2.

Using one of the remaining solar cells, evaluation was conducted in the same manner as in Example 1 and Comparative Example 1. As a result, the solar cell was found to have excellent solar cell characteristics as well as in Example 2.

EXAMPLE 6

Figure 3:
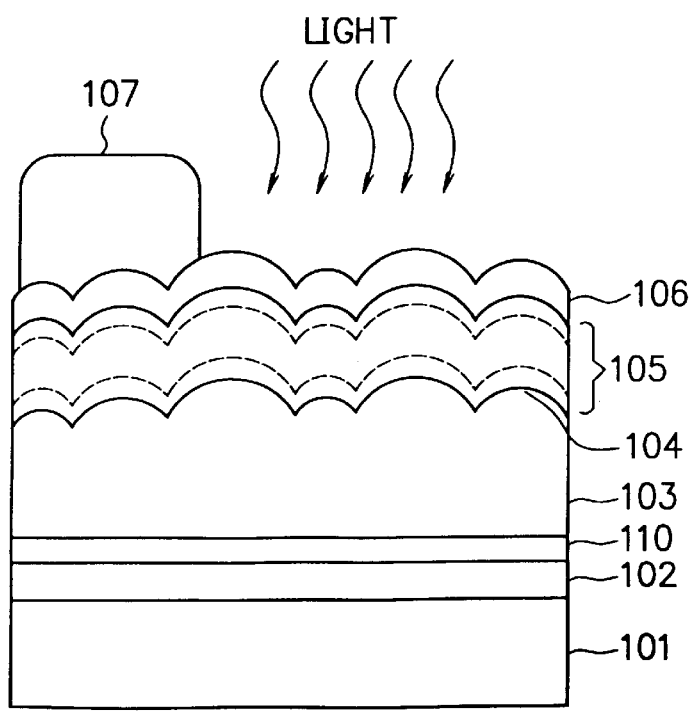
FIG. 3 is a schematic cross-sectional view illustrating the configuration of a further example of a photovoltaic element (a solar cell) according to the present invention.

The procedures of Example 2 were repeated, except that an intermediate layer comprising a 300 Å thick aluminum oxide film was formed by sputtering an aluminum target by oxygen gas and the intermediate layer was interposed between the back reflecting layer and the transparent and electrically conductive layer, to obtain a plurality of solar cells of the configuration shown in FIG. 3.

For one of the resultant solar cells, its cross section was observed by means of SEM. As a result, the light incident side surface region of the transparent and electrically conductive layer was found to have a structural pattern shown in FIG. 3.

Using one of the remaining solar cells, evaluation was conducted in the same manner as in Example 1 and Comparative Example 1. As a result, the solar cell was found to have excellent solar cell characteristics as well as in Example 2.

As apparent from the above description, a solar cell (a photovoltaic element) having such a specific transparent and electrically conductive layer as previously described according to the present invention has significantly improved in the solar cell characteristics including photoelectric conversion efficiency, open-circuit voltage, short-circuit photo current, open-circuit voltage at low illuminance, and leakage current. And the solar cell (the photovoltaic element) excels in mechanical strength and has a significantly improved durability in the outdoor exposure test, the HHRB test, and the light irradiation test.

The present invention enables efficient production of a high performance solar cell (photovoltaic element) at a reasonable cost.

TABLE 1

| name of layer | constituent | revolution speed (rpm) | substrate temperature (° C.) | layer thickness (μm) | gas used | formation method |
|---|---|---|---|---|---|---|
| BR layer | Al | 8 | 25 | 0.05 | Ar | sputtering |
| TEC layer | ZnO | 1 | 150→350 | 1.0 | Ar | sputtering |

| name of layer | | constituent | substrate temperature (° C.) | layer thickness (μm) | | formation method |
|---|---|---|---|---|---|---|
| semiconductor layer | n-type layer | a-Si:H:P | 350 | 0.02 | | RF plasma CVD |
| | i-type layer | a-SiGe:H | 350 | 0.10 | | MW plasma CVD |
| | p-type layer | μc-Si:H:B | 200 | 0.005 | | RF plasma CVD |

| name of layer | constituent | substrate temperature (° C.) | layer thickness (μm) | gas used | formation method |
|---|---|---|---|---|---|
| upper electrode | ITO | 160 | 0.08 | Ar | sputtering |

BR: back reflecting
TEC: transparent and electrically conductive

TABLE 2

| name of layer | constituent | revolution speed (rpm) | substrate temperature (° C.) | layer thickness (μm) | gas used | formation method |
|---|---|---|---|---|---|---|
| TEC layer | ZnO | 8 | 200 | 1.0 | Ar | sputtering |

TABLE 3

| name of layer | constituent | revolution speed (rpm) | substrate temperature (° C.) | layer thickness (μm) | gas used | formation method |
|---|---|---|---|---|---|---|
| BR layer | Al | 8 | 25 | 0.05 | Ar | sputtering |
| 1st TEC layer | ZnO | 8 | 120 | 0.1 | Ar + O₂ | sputtering |
| 2nd TEC layer | ZnO | 8 | 250 | 0.9 | Ar | sputtering |

| name of layer | | constituent | substrate temperature (° C.) | layer thickness (μm) | formation method |
|---|---|---|---|---|---|
| semiconductor layer | 1st n-type layer | a-Si:H:P | 300 | 0.02 | RF plasma CVD |
| | 1st i-type layer | a-SiGe:H | 380 | 0.10 | MW plasma CVD |
| | 1st p-type layer | μc-Si:H:B | 200 | 0.005 | RF plasma CVD |
| | 2nd n-type layer | a-Si:H:P | 220 | 0.01 | RF plasma CVD |
| | 2nd i-type layer | a-SiGe:H | 380 | 0.09 | MW plasma CVD |
| | 2nd p-type layer | μc-Si:H:B | 200 | 0.005 | RF plasma CVD |
| | 3rd n-type | a-Si:H:P | 220 | 0.01 | RF plasma CVD |

TABLE 3-continued

| name of layer | constituent | substrate temperature (° C.) | layer thickness (μm) | gas used | formation method |
|---|---|---|---|---|---|
| 3rd i-type layer | a-Si:H | 250 | 0.09 | | RF plasma CVD |
| 3rd p-type layer | μc-Si:H:B | 160 | 0.005 | | RF plasma CVD |
| upper electrode | ITO | 160 | 0.08 | Ar + O$_2$ | sputtering |

TABLE 4

| vacuum vessel | target | name of layer | constituent | substrate temperature (° C.) | layer thickness (μm) | sputtering gas | formation method |
|---|---|---|---|---|---|---|---|
| 1003 | Al | BR layer | Al | 30 | 0.15 | Ar | sputtering |
| 1004 | Al | intermediate layer | Al$_2$O$_3$ | 30 | 0.02 | Ar + O$_2$ | sputtering |
| 1005 | ZnO | 1$^{st}$ TEC layer | ZnO | 150 | 0.15 | Ar + O$_2$ | sputtering |
| 1006 | ZnO | 2$^{nd}$ TEC layer | ZnO | 300 | 0.95 | Ar | sputtering |

| vacuum vessel | name of layer | constituent | substrate temperature (° C.) | layer thickness (μm) | formation method |
|---|---|---|---|---|---|
| 1103-a | 1$^{st}$ n-type layer | a-Si:H:P | 300 | 0.02 | RF plasma CVD |
| 1104-a | 1$^{st}$ i-type layer | a-SiGe:H | 380 | 0.12 | MW plasma CVD |
| 1103-b | 1$^{st}$ p-type layer | μc-Si:H:B | 200 | 0.01 | RF plasma CVD |
| 1103-c | 2$^{nd}$ n-type layer | a-Si:H:P | 220 | 0.01 | RF plasma CVD |
| 1104-b | 2$^{nd}$ i-type layer | a-SiGe:H | 380 | 0.12 | MW plasma CVD |
| 1103-d | 2$^{nd}$ p-type layer | μc-Si:H:B | 200 | 0.01 | RF plasma CVD |
| 1103-e | 3$^{rd}$ n-type layer | a-Si:H:P | 220 | 0.01 | RF plasma CVD |
| 1104-c | 3$^{rd}$ i-type layer | a-Si:H | 250 | 0.09 | RF plasma CVD |
| 1103-f | 3$^{rd}$ p-type layer | μc-Si:H:B | 160 | 0.005 | RF plasma CVD |

| vacuum vessel | target | name of layer | constituent | substrate temperature (° C.) | layer thickness (μm) | sputtering gas | formation method |
|---|---|---|---|---|---|---|---|
| 1105 | ITO | upper electrode | ITO | 160 | 0.75 | Ar + O$_2$ | sputtering |

What is claimed is:

1. A photovoltaic element comprising a back reflecting layer, a transparent and electrically conductive layer, a semiconductor layer comprising a non-single crystalline silicon semiconductor material containing hydrogen atoms and having at least a semiconductor junction, and an upper transparent electrode layer comprising a metal oxide material stacked in this order on a substrate, and a collecting electrode provided on said upper transparent electrode layer, wherein said transparent and electrically conductive layer comprises a zinc oxide material and has a light incident side surface region with a cross section having a plurality of arcs arranged while being contacted with each other, said arcs having a radius of curvature in the range of 300 Å to 6 μm and an angle of elevation from the center of the curvature in the range of 30 to 155°, said cross section comprising said plurality of arcs at a proportion of 80% or more versus the entire region of the cross section.

2. A photovoltaic element according to claim 1, wherein the transparent and electrically conductive layer has a two-layered structure comprising a first transparent and electrically conductive layer and a second transparent and electrically conductive layer stacked in this order on the substrate, said first transparent and electrically conductive layer comprising an aggregation of zinc oxide crystal grains having reg ions whose c-axis is parallel to the surface of the substrate at a proportion of 50 to 99% versus the entire region of the cross section, and said second transparent and electrically conductive layer comprising an aggregation of prismatic zinc oxide crystal grains whose longitudinal direction is parallel to the c-axis of the zinc oxide and having regions in which said prismatic zinc oxide crystal grains are aggregated radiately to the direction perpendicular to the surface of the substrate at a proportion of 70% or more versus the entire region of the cross section.

3. A photovoltaic element according to claim 1, wherein the transparent and electrically conductive layer has a thickness in the range of 5000 Å to 3 μm.

4. A photovoltaic element according to claim 2, wherein the first transparent and electrically conductive layer has a thickness corresponding to a proportion of 1 to 30% of the thickness of the entire transparent and electrically conductive layer.

5. A photovoltaic element according to claim 1, wherein the transparent and electrically conductive layer has a conductivity in the range of $10^{-8}$ (1/Ωcm) to $10^{-2}$ (1/Ωcm).

6. A photovoltaic element according to claim 2, wherein each of the first and second transparent and electrically conductive layers has a conductivity in the range of $10^{-8}$ (1/Ωcm) to $10^{-2}$ (1/Ωcm).

7. A photovoltaic element according to claim 2, wherein each of the first and second transparent and electrically conductive layers is formed by means of sputtering, wherein the first transparent and electrically conductive layer is formed at a substrate temperature in the range of 50° C. to 200° C., the second transparent and electrically conductive layer is formed at a substrate temperature in the range of 150° C. to 400° C., and the substrate temperature for the formation of the second transparent and electrically conductive layer is at least 30° C. higher than that for the formation of the first transparent and electrically conductive layer.

8. A photovoltaic element according to claim 2, wherein the first transparent and electrically conductive layer is formed by means of sputtering in an atmosphere containing 50% or more of oxygen.

9. A photovoltaic element according to claim 1 which further comprises an intermediate layer comprising aluminum oxide interposed between the back reflecting layer and the transparent and electrically conductive layer.

10. A photovoltaic element according to claim 9, wherein the intermediate layer comprises a layer formed by a reacting sputtering process of sputtering a target comprising aluminum in an atmosphere containing 80% or more of oxygen.

11. A photovoltaic element according to claim 9, wherein the intermediate layer comprises a surface aluminum oxide layer formed by oxidizing the surface of an aluminum layer as the back reflecting layer.

12. A photovoltaic element according to claim 1, wherein the semiconductor layer has a semiconductor junction between a microcrystalline silicon material and an amorphous silicon material.

13. A photovoltaic element according to claim 1, wherein the semiconductor layer comprises a plurality of semiconductor layers, at least one of said semiconductor layers containing at least an element selected from the group consisting of Ge, O, N, and C.

14. A photovoltaic element according to claim 1, wherein the upper transparent electrode comprises a material selected from the group consisting of $SnO_2$, $In_2O_3$, ITO, and composites of two or more thereof.

15. A photovoltaic element according to claim 1, wherein the collecting electrode comprises a stacked body comprising a core comprising a metal wire which has a clad layer and a carbon layer stacked in this order on said core.

16. A photovoltaic element according to claim 1, wherein the cross section of the light incident side surface region of the transparent and electrically conductive layer comprises a plurality of arcs arranged while being contacted with each other, each arc having a radius of curvature in the range of 500 Å to 3 μm and an angle of elevation from the center of the curvature in the range of 50° to 150°, and said cross section has a plurality of regions each based on a bisection of the arc which passes the center of the curvature and which is substantially perpendicular to the surface of the substrate on which the transparent and electrically conductive layer is formed at a proportion of 80% or more versus the entire region of the cross section.

17. A photovoltaic element according to claim 1, wherein the cross section of the light incident side surface region of the transparent and electrically conductive layer comprises a plurality of arcs arranged while being contacted with each other, each arc having a radius of curvature in the range of 900 Å to 2 μm and an angle of elevation from the center of the curvature in the range of 70° to 135°, and said cross section has a plurality of regions each based on a bisection of the arc which passes the center of the curvature and which is substantially perpendicular to the surface of the substrate on which the transparent and electrically conductive layer is formed at a proportion of 80% or more versus the entire region of the cross section.

18. A photovoltaic element according to claim 1, wherein the back reflecting layer is composed of a metallic material containing Al as a matrix.

19. A photovoltaic element according to claim 1, wherein the cross section contains a plurality of regions each based on a bisection of the arc which passes the center of the curvature and which is substantially perpendicular to the surface of the substrate on which the transparent and electrically conductive layer is formed at a proportion of 80% or more versus the entire region of the cross section.

20. A photovoltaic element module in which a plural number of the photovoltaic element according to claim 1 are electrically integrated and the integrated photovoltaic elements are sealed by a sealing resin.

21. A photovoltaic element module in which a plural number of the photovoltaic element according to claim 2 are electrically integrated and the integrated photovoltaic elements are sealed by a sealing resin.

* * * * *

UNITED STATES PATENT AND TRADEMARK OFFICE
CERTIFICATE OF CORRECTION

PATENT NO. : 6,140,570
DATED : October 31, 2000
INVENTOR(S) : Toshimitsu Kariya

It is certified that error appears in the above-identified patent and that said Letters Patent is hereby corrected as shown below:

Title page,
Item [54], TITLE,
"PHOTOVOLATIC" should read -- PHOTOVOLTAIC --.

Item [56], OTHER PUBLICATIONS,
"Fonf. 1425-1426" should read -- Conf. 1425-1426 --.

Item [57], ABSTRACT,
Line 6, "in contacted" should read -- in contact --.

Column 1,
Title, "PHOTOVOLATIC" should read -- PHOTOVOLTAIC --;
Line 14, "relates a" should read -- relates to a --;
Line 46, "allow" should read -- alloy --;
Line 50, "et als.," should read -- et al., --;
Line 56, "nickle" should read -- nickel --.

Column 2,
Line 6, "a irregular" should read -- an irregular --;
Line 10, "etal.," should read -- et al., --;
Line 63, "entail" should read -- arise --.

Column 3,
Line 11, "against particularly" should read -- particularly against --;
Line 20, "in outdoors" should read -- outdoors --;
Line 52, "a light" should read -- of a light --;
Line 65, "eachother," should read -- each other, --.

Column 5,
Line 35, "radiately" should read -- radially --;
Line 46, "(1/$\Omega$cm)" should read -- (1/$\Omega$cm). --;

Column 6,
Line 24, "indicate" should read -- indicates --;
Line 48, "these constituents" should read -- these are constituents --;
Line 52, "electrically" should read -- electrically conductive --.

UNITED STATES PATENT AND TRADEMARK OFFICE
CERTIFICATE OF CORRECTION

PATENT NO.  : 6,140,570
DATED       : October 31, 2000
INVENTOR(S) : Toshimitsu Kariya It is certified that error appears in the above-identified patent and that said Letters Patent is hereby corrected as shown below:

Column 7,
Line 7, "formed is" should read -- formed it is --;
Line 13, "such a" should read -- such as a --;
Line 52, "thinner" should read -- thin --;
Line 55, "so that" should read -- that --.

Column 8,
Line 49, "has" should read -- having --;
Line 50, "above described." should read -- described above. --.

Column 9,
Line 4, "102, then" should read -- 102, and then --;
Line 38, "it was found" should read -- Based on the results shown in FIG. 16, it was found --;
Line 43, "term the" should read -- term "the -- and "more" should read -- more" --.

Column 10,
Line 2, "region" should read -- regions --;
Line 17, "This," should read -- Thus, --;
Line 26, "substan" should be deleted;
Line 27, "tially" should be deleted;
Line 28, "free of" should read -- free from --;
Line 29, "from" should read -- of --.

Column 11,
Line 53, "$10^{31\ 2}$" should read -- $10^{-2}$ --;
Line 64, "somewhat" should read -- some --.

Column 12,
Line 31, "there" should be deleted;
Line 46, "structures," should read -- structures --.

Column 13,
Line 9, "the yield" should read -- yield --;
Line 19, "of layer" should read -- layer --.

UNITED STATES PATENT AND TRADEMARK OFFICE
CERTIFICATE OF CORRECTION

PATENT NO. : 6,140,570
DATED : October 31, 2000
INVENTOR(S) : Toshimitsu Kariya

It is certified that error appears in the above-identified patent and that said Letters Patent is hereby corrected as shown below:

Column 14,
Line 9, "to be" should be deleted;
Line 12, "contacted" should read -- contact --;
Line 26, "photo current" should read -- photocurrent --;
Line 49, "oxide" should read -- oxide, --.

Column 15,
Line 1, "to" should be deleted;
Line 2, "be" should be deleted;
Line 13, "been" should be deleted.

Column 16,
Line 35, "such" should be deleted;
Line 45, "grater" should read -- greater --.

Column 17,
Line 23, "be of" should read -- be of a --;
Line 46, "(a phenomena," should read -- (a phenomenon --;
Line 51, "comprise" should be deleted;
Line 54, "where the" should read -- of the --.

Column 18,
Line 15, "limiting" should read -- limitating --;
Line 43, "to be" should be deleted.

Column 19,
Line 1, "photo current" should read -- photocurrent --;
Line 49, "gas to" should read -- gas is to --.

Column 20,
Line 5, "whereby" should read -- thereby --;
Lines 27 and 41, "above," should read -- above --;
Line 46, "CVD," should read -- CVD --;
Line 52, "formation," should read -- formation --.

Column 21,
Line 18, "a n-type" should read -- an n-type --;
Line 23, "thep-type" should read -- the p-type --;
Line 25, "imparting" should read -- of imparting --;
Line 26, "be" should read -- be used --;

UNITED STATES PATENT AND TRADEMARK OFFICE
CERTIFICATE OF CORRECTION

PATENT NO. : 6,140,570
DATED : October 31, 2000
INVENTOR(S) : Toshimitsu Kariya

It is certified that error appears in the above-identified patent and that said Letters Patent is hereby corrected as shown below:

Column 21 contd.,
Line 50, "difficult to" should read -- difficult for --;
Line 61, "it is desired" should read -- is desired --.

Column 22,
Line 28, "to have" should read -- must have --;
Line 29, "photo current" should read -- photocurrent --;
Line 37, "is constituted by" should read -- comprises --;
Line 49, "to be" should be deleted --;
Line 51, "resin a" should read -- resin, a --
Line 67, "being" should be deleted.

Column 23,
Line 11, "maybe" should read -- may be --;
Line 58, "thermo composition" should read -- thermocompression --.

Column 24,
Line 48, "subjecting" should read -- subjected --.

Column 25,
Line 19, "sample)," should read -- sample) --;
Line 30, "has" should read -- had --;
Line 42, "the above" should be deleted;
Line 44, "EX. 1" should read -- Ex. 1 --;
Line 50, "and HHRB" should read -- and HHRB --;
Line 54, "maintained" (first occurrence) should read -- then --;
Line 57, "for the" should be deleted;
Line 63, "photo current" should read -- photocurrent --;

Column 26,
Lines 3, 5, 24, 27, and 31, "comp." should read -- Comp. --;
Lines 10, 16, 37, and 50, "photo current," should read -- photocurrent, --;
Line 41, "uniformly" should read -- uniformly dropped --;
Line 57, "it was" should be deleted;
Line 60, "it was" should be deleted and "comp." should read -- Comp. --;
Line 65, "it was" should be deleted and "comp." should read -- Comp. --;

UNITED STATES PATENT AND TRADEMARK OFFICE
CERTIFICATE OF CORRECTION

PATENT NO. : 6,140,570
DATED : October 31, 2000
INVENTOR(S) : Toshimitsu Kariya

It is certified that error appears in the above-identified patent and that said Letters Patent is hereby corrected as shown below:

Column 27,
Line 18, "their" should read -- and their --;
Line 21, "of 300" should read -- 300 --;
Line 31, "substantially perpendicular" should read -- substantially perpendicular --;
Line 50, "fist i-type" should read -- first i-type --.

Column29,
Line 14, "prevent from" should read -- prevent --;
Line 49, "constant at a" should read -- constant, --;
Line 51, "whereby" should read -- thereby --;
Line 54, "to closer" should read -- closer --;

Column 30,
Line 48, "from" should read -- diffusion of --;
Line 49, "'s formstion" should read -- a formation --;

Column 31,
Line 57, "whereby" should read -- thereby --;

Column 32,
Line 7, "a fist" should read -- a first --;
Line 19, "it was" should read -- was --;
Line 25, "shown" should read -- shown in --;
Line 30, "3 mm in" should read -- 0.3 mm --;
Line 50, "3 cm" should read -- by 3 cm --.

Column 33,
Line 9, "a evaluation" should read -- an evaluation --;
Line 56, "in the" should be deleted;
Line 58, "photo current," should read -- photocurrent, --.

UNITED STATES PATENT AND TRADEMARK OFFICE
CERTIFICATE OF CORRECTION

PATENT NO. : 6,140,570
DATED : October 31, 2000
INVENTOR(S) : Toshimitsu Kariya

It is certified that error appears in the above-identified patent and that said Letters Patent is hereby corrected as shown below:

<u>Column 36,</u>
Line 6, "reg ions" should read -- regions --.

Signed and Sealed this

Thirteenth Day of November, 2001

Attest:

*Nicholas P. Godici*

NICHOLAS P. GODICI
*Attesting Officer*        *Acting Director of the United States Patent and Trademark Office*